United States Patent
Donnelly et al.

(10) Patent No.: US 10,864,920 B1
(45) Date of Patent: Dec. 15, 2020

(54) VEHICLE OPERATOR AWARENESS SYSTEM

(71) Applicant: UATC, LLC, San Francisco, CA (US)

(72) Inventors: Richard Brian Donnelly, Pittsburgh, PA (US); Philipp Haban, Pittsburgh, PA (US); Christopher Matthew D'Eramo, Bethel Park, PA (US); Chad Johnathan Staller, Verona, PA (US); Clifford Shaun Webb, Pittsburgh, PA (US); Douglas Dallesandro, Pittsburgh, PA (US)

(73) Assignee: UATC, LLC, San Francisco, CA (US)

( * ) Notice: Subject to any disclaimer, the term of this patent is extended or adjusted under 35 U.S.C. 154(b) by 75 days.

(21) Appl. No.: 16/154,264

(22) Filed: Oct. 8, 2018

Related U.S. Application Data

(60) Provisional application No. 62/725,526, filed on Aug. 31, 2018.

(51) Int. Cl.
| | |
|---|---|
| *G08B 23/00* | (2006.01) |
| *B60W 50/14* | (2020.01) |
| *B60W 40/08* | (2012.01) |
| *G06K 9/00* | (2006.01) |

(52) U.S. Cl.
CPC ............ *B60W 50/14* (2013.01); *B60W 40/08* (2013.01); *G06K 9/00791* (2013.01); *B60W 2040/0818* (2013.01); *B60W 2050/146* (2013.01)

(58) Field of Classification Search
None
See application file for complete search history.

(56) References Cited

U.S. PATENT DOCUMENTS

| | | | |
|---|---|---|---|
| 5,253,228 A | 10/1993 | Truett | |
| 9,150,200 B2* | 10/2015 | Urhahne | ............ G08B 21/0415 |
| 10,647,333 B1* | 5/2020 | Donnelly | ............... B60W 50/14 |
| 2007/0024454 A1* | 2/2007 | Singhal | ................... A61B 5/162 |
| | | | 340/576 |
| 2008/0231461 A1* | 9/2008 | Sanchez | ............... B60K 28/066 |
| | | | 340/575 |
| 2009/0040874 A1 | 2/2009 | Rooney et al. | |
| 2009/0267777 A1* | 10/2009 | Kumar | ................... G08B 21/06 |
| | | | 340/576 |

(Continued)

*Primary Examiner* — Julie B Lieu
(74) *Attorney, Agent, or Firm* — Dority & Manning, P.A.

(57) ABSTRACT

Systems and methods for maintaining autonomous vehicle operator awareness are provided. A method can include determining, by a computing system, an awareness challenge for an operator of a vehicle. The awareness challenge can be based on object data. The awareness challenge can have one or more criteria. The criteria can include a challenge response interval, a response time, and an action for satisfying the awareness challenge. The method can include initiating, by the computing system, a timer measuring elapsed time from a start time of the challenge response interval. The method can include communicating to the operator, by the computing system, a soft notification indicative of the awareness challenge during the challenge response interval. The method can include determining, by the computing system, whether the operator provides a user input after the response time interval and whether the user input corresponds to the action for satisfying the awareness challenge.

15 Claims, 11 Drawing Sheets

(56) References Cited

U.S. PATENT DOCUMENTS

| | | | |
|---|---|---|---|
| 2011/0205070 A1* | 8/2011 | Kumar | G08B 21/06 |
| | | | 340/576 |
| 2011/0241862 A1 | 10/2011 | Debouk et al. | |
| 2013/0131907 A1 | 5/2013 | Green et al. | |
| 2016/0334229 A1* | 11/2016 | Ross | G01C 21/34 |
| 2016/0346695 A1* | 12/2016 | Hoory | G06K 9/00832 |
| 2017/0334459 A1* | 11/2017 | McNew | B60R 11/0229 |
| 2018/0348751 A1* | 12/2018 | Newman | G06K 9/00845 |
| 2018/0365533 A1* | 12/2018 | Sathyanarayana | G05D 1/0221 |
| 2019/0025827 A1* | 1/2019 | Palmer | G05D 1/0061 |
| 2019/0276046 A1* | 9/2019 | Palmer | B60W 50/12 |
| 2019/0286948 A1* | 9/2019 | Sathyanarayana | B60W 30/095 |
| 2020/0017124 A1* | 1/2020 | Camhi | G05D 1/0088 |
| 2020/0026271 A1* | 1/2020 | Thomson | B60L 58/10 |

\* cited by examiner

VEHICLE OPERATOR AWARENESS SYSTEM

PRIORITY CLAIM

The present application is based on and claims benefit of U.S. Provisional Application No. 62/725,526 having a filing date of Aug. 31, 2018, which is incorporated by reference herein.

FIELD

The present disclosure relates generally to devices, systems, and methods for maintaining the awareness of vehicle operators.

BACKGROUND

An autonomous vehicle can be capable of sensing its environment and navigating with little to no human input. In particular, an autonomous vehicle can observe its surrounding environment using a variety of sensors and can attempt to comprehend the environment by performing various processing techniques on data collected by the sensors. Given knowledge of its surrounding environment, the autonomous vehicle can navigate through such surrounding environment.

SUMMARY

Aspects and advantages of embodiments of the present disclosure will be set forth in part in the following description, or can be learned from the description, or can be learned through practice of the embodiments.

One aspect of the present disclosure is directed to a computer-implemented method of generating a vehicle operator challenge. The method includes obtaining, by a computing system including one or more computing devices, sensor data associated with a surrounding environment of an autonomous vehicle. The method further includes determining, by the computing system, object data associated with one or more objects within the surrounding environment based at least in part on the sensor data. The object data can be indicative of one or more characteristics associated with each of the one or more objects. The method further includes generating, by the computing system, an awareness challenge based at least in part on the object data. The awareness challenge includes a prompt based at least in part on the object data. The method further includes providing, by the computing system, the prompt of the awareness challenge to an operator of the autonomous vehicle.

Another aspect of the present disclosure is directed to computing system for generating a vehicle operator challenge. The computing system including one or more processors; and one or more tangible, non-transitory, computer readable media that collectively store instructions that when executed by the one or more processors cause the computing system to perform operations. The operations include obtaining sensor data associated with a surrounding environment of the autonomous vehicle. The operations further include determining object data associated with an object within the surrounding environment based at least in part on the sensor data. The object data is indicative of one or more characteristics associated with the object. The operations further include generating an awareness challenge based at least in part on the object data. The awareness challenge includes a prompt based at least in part on the object data. The operations further include providing the prompt of the awareness challenge to an operator of the autonomous vehicle. The operations further include initiating a timer measuring elapsed time from a start time of a challenge response interval indicative of a first period of time for the operator to complete the awareness challenge. The operations further include communicating, to the operator of the vehicle, a soft notification indicative of the awareness challenge during the challenge response interval.

Another aspect of the present disclosure is directed to an autonomous vehicle, including one or more output devices, one or more vehicle sensors, one or more processors, and one or more tangible, non-transitory, computer readable media that collectively store instructions that when executed by the one or more processors cause the autonomous vehicle to perform operations. The operations include obtaining, via the one or more vehicle sensors, sensor data associated with a surrounding environment of the autonomous vehicle. The operations further include determining object data associated with one or more objects within the surrounding environment based at least in part on the sensor data. The object data can be indicative of one or more characteristics associated with each of the one or more objects. The operations further include generating an awareness challenge based at least in part on the object data. The awareness challenge includes one or more prompts based at least in part on the object data. The operations further include providing, via the one or more output devices, the one or more prompts of the awareness challenge to an operator of the autonomous vehicle.

Other example aspects of the present disclosure are directed to systems, methods, vehicles, apparatuses, tangible, non-transitory computer-readable media, and memory devices for maintaining the awareness of vehicle operators.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
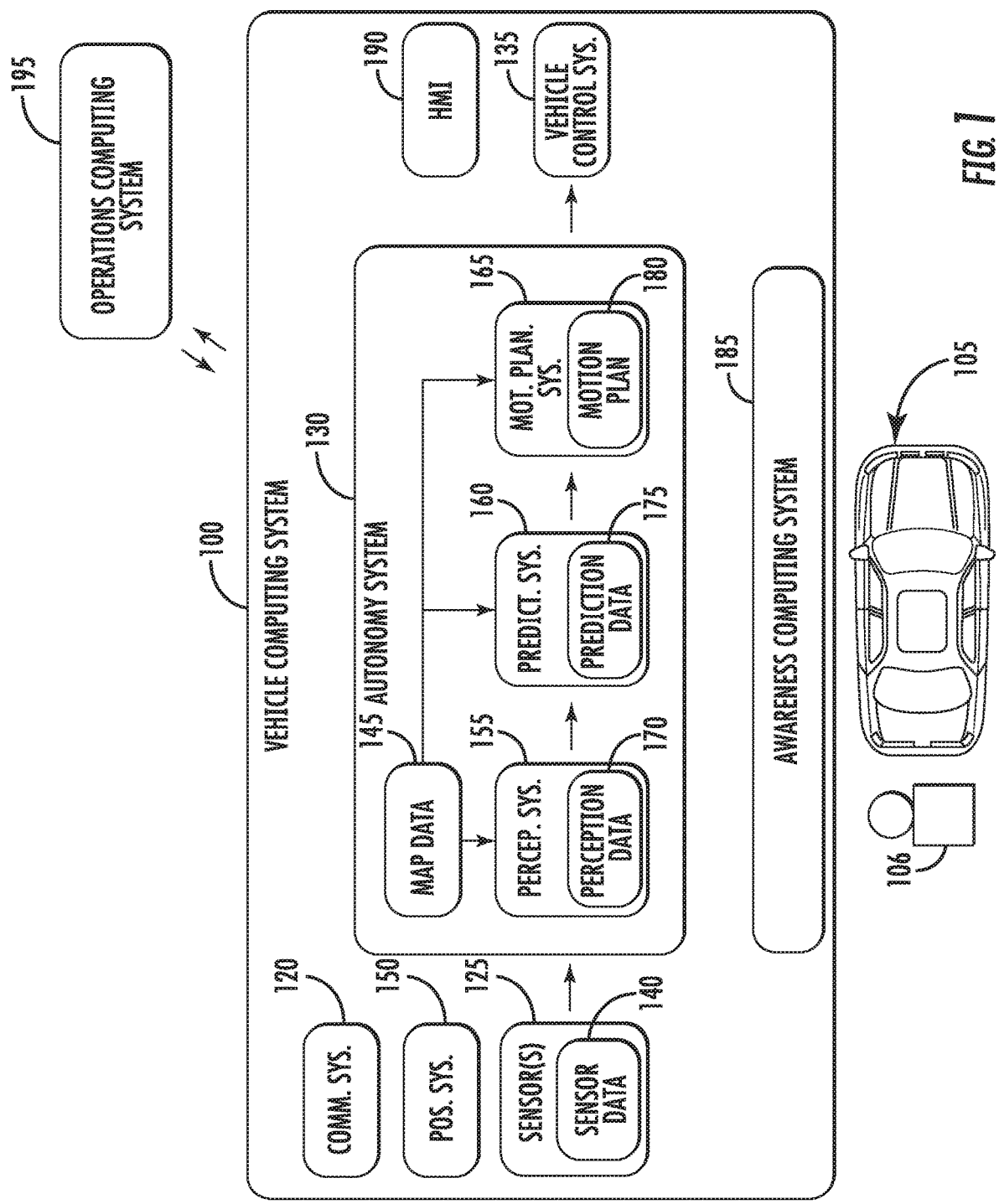
FIG. 1 depicts an example system overview according to example implementations of the present disclosure.

Reference now will be made in detail to embodiments, one or more example(s) of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to maintaining the awareness of a vehicle operator. For instance, an autonomous vehicle can drive, navigate, operate, etc. with minimal and/or no interaction from a human vehicle operator. In some circumstances, a vehicle operator can be present in the vehicle (or remote from the vehicle) in order to take over manual control of the autonomous vehicle. For example, during an autonomous operation testing session under a controlled environment, periodic faults can be injected into an autonomous vehicle's autonomy system to test how the autonomous vehicle responds to certain scenarios. During such faults, the vehicle operator can provide backup control of the autonomous vehicle, such as by assuming manual control of the vehicle.

Figure 3:
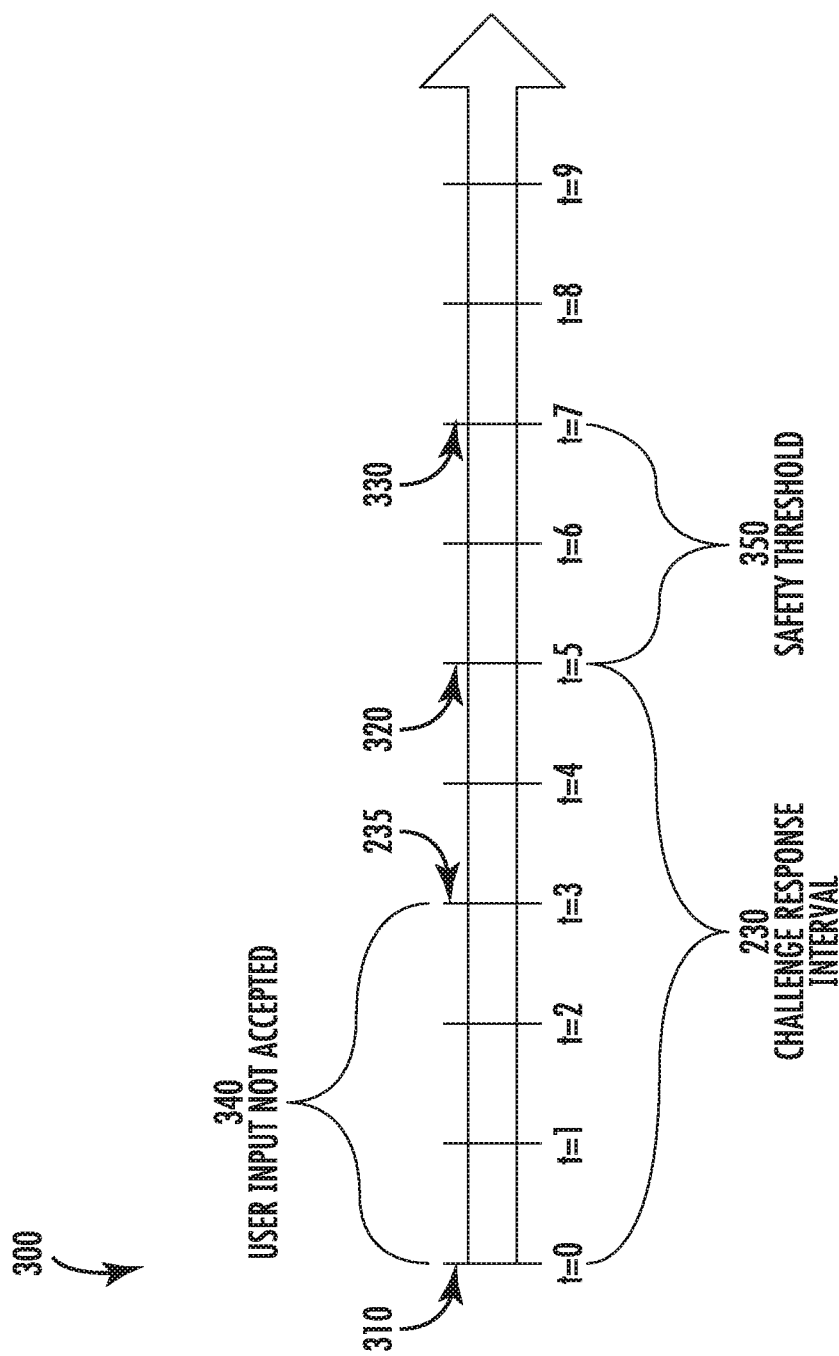
FIG. 3 depicts an example awareness challenge time line according to example implementations of the present disclosure.

The systems and methods of the present disclosure can maintain vehicle operator awareness by engaging the vehicle operator in an awareness challenge. The awareness challenge can prompt the operator of the vehicle to provide an indication that the operator is attentive. For example, an awareness computing system (e.g., implemented via the vehicle's onboard computing system, a remote computing system, etc.) can generate an awareness challenge. The awareness challenge can include various types of criteria. For example, the criteria can include a challenge response interval (e.g., indicating an initial time period for the operator to respond), a prompt, and an action for satisfying the awareness challenge. The prompt can include a request that the operator undertake an action (e.g., by indicating a particular user input, asking a question etc.). The action can include interacting with one or more interfaces (e.g., pressing a button inside the vehicle cabin), answering a question, etc. In some implementations, the prompt and/or action can be based on the vehicle's surroundings. For instance, the awareness computing system can process sensor data acquired by the vehicle and generate a question regarding an object proximate to the vehicle (e.g., "what color is the car to your right?"). The criteria can also include a response time which indicates a point in time, within the challenge response interval, after which the operator can respond to the challenge (e.g., to prevent challenge workarounds). (FIG. 3 depicts an example timing scheme of an awareness challenge.) In this manner, the awareness computing system can dynamically determine the criteria for the awareness challenge to improve the vehicle operator's alertness, interest, and motivation, while reducing the vehicle operator's incentive for developing harmful workarounds.

Once the awareness challenge is issued to the operator, the awareness computing system can initiate a timer and provide a soft notification (e.g., a dimming series of lights, an illuminating series of lights, a haptic feedback that increases or decreases in intensity, etc.) to the operator indicating that the awareness challenge has been issued. The soft notification can include, for example, a visual output (e.g., a dimming series of lights, an illuminating series of lights, a visual output on a user interface, etc.), an audible output (e.g., a single soft sound, etc.), a haptic output (e.g., a vibration of the operator's seat, control device (e.g., steering wheel, stick, other device(s)), etc.), and/or other types of outputs for notifying an operator. In the event that the operator correctly responds within the challenge response interval (and after the response time), the awareness computing system can reset the awareness challenge. In the event that the challenge response interval expires, the awareness computing system can issue a harsh notification (e.g., a sound, etc.). The harsh notification can increase as time continues to elapse. Eventually, if no response is provided, the autonomous vehicle can perform a safe stop routine. Accordingly, the systems and methods of the present disclosure provide improved techniques for maintaining vehicle operator awareness in a manner that is less bothersome to the operator and, yet, further increases safety.

An autonomous vehicle (e.g., ground-based vehicle, etc.) can include various systems and devices configured to control the operation of the vehicle. For example, an autonomous vehicle can include an onboard vehicle computing system (e.g., located on or within the autonomous vehicle) that is configured to operate the autonomous vehicle. The vehicle computing system can obtain sensor data from sensor(s) onboard the vehicle (e.g., cameras, LIDAR, RADAR, etc.), attempt to comprehend the vehicle's surrounding environment by performing various processing techniques on the sensor data, and generate an appropriate motion plan through the vehicle's surrounding environment. For example, the sensor data can be used in a processing pipeline that includes the detection of objects proximate to the autonomous vehicle, object motion prediction, and vehicle motion planning. For example, a motion plan can be determined by the vehicle computing system, and the vehicle can be controlled by a vehicle controller to initiate travel in accordance with the motion plan. The autonomous vehicle can also include one or more output devices such as, for example, one or more display screens (e.g., touch-sensitive interactive display screens), speakers, or other devices configured to provide a vehicle operator with an awareness challenge. In addition, the autonomous vehicle can include one or more input devices such as, for example, touchscreens (e.g., touch-sensitive interactive screens), buttons, motion detectors, microphones, or other devices configured to accept input from a vehicle operator.

A human vehicle operator can be associated with the autonomous vehicle to take manual control of the vehicle, if necessary. For instance, in a testing scenario under a controlled testing environment, an autonomous vehicle can be periodically tested with controlled faults that can be injected into an autonomous vehicle's autonomy system. This can help the vehicle's response to certain scenarios. A vehicle operator can be located within the autonomous vehicle and/or remote from the autonomous vehicle to take control of the vehicle (e.g., in the event the fault results in the vehicle exiting from a fully autonomous mode in the testing environment).

Although many examples are described herein with respect to autonomous vehicles, the disclosed technology is not limited to autonomous vehicles. Any vehicle can utilize the technology described herein for maintaining operator awareness. For example, a non-autonomous vehicle can utilize aspects of the present disclosure to develop awareness challenges for an operator of the non-autonomous vehicle, prompt the vehicle operator to respond in accordance with the awareness challenge, and obtain an associated response.

To help maintain the awareness of a vehicle operator (e.g., of an autonomous vehicle, of a non-autonomous vehicle, etc.), an awareness computing system can be configured to generate an awareness challenge for the vehicle operator. The awareness computing system can be the vehicle's onboard computing system and/or a remote computing system that is remotely located from the vehicle (e.g., an operations computing system). The awareness computing system can determine an awareness challenge having one or more criteria for the operator of a vehicle. For example, the one or more criteria can include a challenge response interval indicative of a first period of time for the operator of the vehicle to complete the awareness challenge, a response time within the first period of time, an action for satisfying the awareness challenge, and a prompt indicative of a request for the action for satisfying the awareness challenge. Each of the values for the one or more criteria can vary depending one or more factors, such as, for example, past awareness challenges. In this manner, the awareness computing system can dynamically determine the one or more criteria for the awareness challenge to improve the vehicle operator's alertness, interest, and motivation, while reducing the vehicle operator's incentive for developing harmful workarounds.

The challenge response interval can be indicative of a first period of time for the operator of the vehicle to complete the awareness challenge. In this manner, the challenge response interval establishes an initial time period within which the operator can satisfy the awareness challenge. As discussed in greater detail below, if the awareness challenge is not satisfied before the expiration of the challenge response interval, the awareness computing system can employ additional measures to encourage an operator to satisfy the awareness challenge.

The response time can be any time within the challenge response interval and identifies the initial opportunity for an operator to satisfy the awareness challenge. Stated differently, the response time can be a point in time after which the vehicle operator can provide a response to the prompt of an awareness challenge. For example, where the challenge response interval is thirty seconds, the response time can indicate a ten-second mark within the thirty-second interval. In such a case, the operator cannot satisfy the awareness challenge until after the ten-second mark of the challenge response interval. In this manner, the awareness computing system can prohibit the operator from satisfying the awareness challenge for a portion of the challenge response interval effectively extending the operator's awareness for at least that portion.

The action for satisfying the awareness challenge can include a task to be performed by the operator of the vehicle. For example, the action for satisfying the awareness challenge can include specific tasks selected to improve the vehicle operator's attention, such as a specific button press, touch screen action, or verbal acknowledgement. In some implementations, the action for satisfying the awareness challenge can include a plurality of tasks. For instance, the action can indicate a specific sequence of one or more tasks to be performed by the operator.

The prompt of the awareness challenge can be a request for the action for satisfying the challenge. For instance, the awareness computing system can provide the prompt of the awareness challenge to an operator of a vehicle to indicate to the operator the correct action for satisfying the awareness challenge. For example, the awareness computing system can output (visually, audibly, tactilely, etc.) a prompt indicating to the operator of the vehicle that the specific task of pressing a particular button after the response time can satisfy the awareness challenge. In another example, the prompt can include a question and the action for satisfying the awareness challenge can include the answer to that question.

In some implementations, the awareness computing system can generate the prompt of the awareness challenge based on a vehicle's surrounding environment. For example, where the vehicle is an autonomous vehicle, the awareness computing system can obtain sensor data associated with a surrounding environment of the autonomous vehicle via the plurality of vehicle sensors. The sensor data can include raw sensor data and/or data that has been processed or manipulated in some manner. The computing system can determine object data associated with one or more objects (e.g., sign posts, vehicles, pedestrians, etc.) within the surrounding environment based at least in part on the sensor data. In some implementations, the object data can identify one or more characteristics (e.g., color, size, type, location, etc.) associated with each of the one or more objects. For example, the object data can be similar to, include at least a portion of, or be the same as perception data determined by a vehicle's autonomy computing system.

In some implementations, the awareness computing system can generate an awareness challenge based at least in part on the object data. For instance, the awareness challenge can include a prompt based at least in part on the object data. The prompt can be indicative of one or more questions associated with at least one of a type or a location of an object within the surrounding environment of an autonomous vehicle. For example, the prompt can include a question that asks: "What is the color of the car to your right." In this manner, the prompt can inform the operator that the answer to the question can satisfy the awareness challenge. The awareness computing system can provide the prompt of the awareness challenge to an operator of the autonomous vehicle. For instance, the awareness computing system can output an audible communication indicative of the prompt via one or more output devices (e.g., speakers). The awareness computing system can then obtain data indicative of a user input (e.g., an answer) in response to the prompt. For example, the awareness computing system can obtain from the operator, data indicative of one or more answers to the one or more questions of the awareness challenge. For example, when a prompt requests the operator of the vehicle to identify the color of a particular car, the operator can provide user input indicative of the color of that car (e.g., "blue," "green," etc.).

In some implementations, the criteria of the awareness challenge can be associated with the vehicle operator. For example, the awareness computing system can determine the criteria of the awareness challenge based on an operator history associated with the operator of the vehicle. The operator history can indicate, for example, how well the operator has responded to previous awareness challenges. For instance, the awareness computing system can determine a response time closer to the end of the challenge response interval (e.g., response time of 25 seconds within an interval of thirty seconds) when the operator history indicates that the operator has responded quickly and/or correctly in the past. In this manner, the awareness computing system can avoid operator complacency by continually decreasing the time between the response time and the expiration of the challenge response interval, thereby increasing the difficulty of satisfying the awareness challenge before its expiration.

In some implementations, the criteria of the awareness challenge can be associated with at least one of a navigation route associated with the vehicle and/or a motion plan associated with an autonomous vehicle. For example, the awareness computing system can determine longer (e.g., in high stimulus environments), and/or shorter (e.g., in low stimulus environments) challenge response intervals based on the navigation route or motion plan. For example, the awareness computing system can determine a longer challenge response interval where the navigation route and/or motion plan indicate a high stimulus environment (e.g., rocky terrains, curvy roads, irregular scenery, etc.), so as not to distract the operator. In another example, the awareness computing system can determine a shorter challenge response interval where the navigation route and/or motion plan indicate a low stimulus environment (e.g., open unoccupied remote highways, familiarized scenery, etc.). In this manner, the awareness computing system can strategically determine criteria of an awareness challenge based on the anticipated additional stimulus from a navigation route and/or motion plan.

In some implementations, where the vehicle is an autonomous vehicle, the criteria of the awareness challenge can be associated with a performance associated with the autonomous vehicle. For instance, the awareness computing system can determine the criteria of the awareness challenge based on the stage of development of a software package being tested on the autonomous vehicle in a controlled environment. If the software package is being tested for a first time and/or an early version of the software is being tested (e.g., a first/initial version, etc.), the awareness computing system can determine a shorter challenge response interval designed to increase the operator's awareness. Conversely, the awareness computing system can determine a longer challenge response interval where the software package has been tested a number of times and/or has been developed across several versions. In this manner, the awareness computing system can modify the intended awareness of an operator based on the predictability of the performance of the autonomous vehicle (e.g., when testing software within a controlled testing environment).

In some implementations, the criteria of the awareness challenge can be randomized. For instance, the awareness computing system can, in some implementations, predetermine a series of values for each of the criteria of the awareness challenge. The values for each of the criteria can be stored on board a vehicle, one or more external servers, etc. In this implementation, the awareness computing system can determine the criteria for an awareness challenge by iteratively selecting one or more predetermined values at random. For example, the awareness computing system can randomly (e.g., via a random number generator, etc.) select a value for the challenge response interval from the predetermined series of values. In turn, the awareness computing system can randomly select a value for the response time from the predetermined series of values based in part on the selected challenge response interval (e.g., by using the challenge response interval as an upper bound). In this manner, the awareness computing system can randomize the one or more criteria of an awareness challenge.

In some implementations, the criteria of the awareness challenge can be based on supervisor input. For instance, in some implementations, a supervisor can oversee one or more operators of a plurality of vehicles. For example, the awareness computing system can output data indicative of the performance of one or more operators to one or more remote computing devices. In this case, the supervisor can monitor the performance data (e.g., via one or more output devices of the remote computing device(s)) to oversee the operator(s). Based on the performance data, the supervisor can transmit (e.g., via the remote computing device(s)) supervisor input indicative of a desired change to one or more criteria of an awareness challenge (e.g., a longer challenge response interval to reward high performance) to the awareness computing system. In response, the awareness computing system can accept the supervisor input and, based on the supervisor input determine the criteria of the awareness challenge (e.g., determine a longer challenge response interval, adjust the frequency of the awareness challenges, etc.).

After determining the criteria of the awareness challenge, the awareness computing system can initiate a timer measuring elapsed time from a start time of the challenge response interval. For example, if the challenge response time indicates thirty seconds, the timer can measure the elapsed time from zero and the challenge response interval can expire when the elapsed time reaches thirty seconds. The awareness computing system can communicate, to the operator of the vehicle, a soft notification indicative of the awareness challenge response interval. In some implementations, the awareness computing system can communicate to the operator of the vehicle the soft notification as time elapses. The soft notification can include at least one stimulus such as visual, tactile, or auditory, etc. For example, the soft notification can include a visual stimulus that illuminates, dulls, changes color, gradient, etc. as time elapses. For example, the soft notification can include a series of lights indicating the elapsed time within the challenge response interval. In such a case, the awareness computing system can control the series of lights to change one or more of the lights in a predefined order as the elapsed time approaches the expiration of the challenge response interval. For instance, one or more of the series of lights can illuminate or dull in proportion to the elapsed time. In some implementations, the awareness computing system can provide (e.g., visually, tactilely, audibly, etc.) one or more criteria of the awareness challenge to the operator such as the challenge response interval, response time, and/or the prompt requesting the action for satisfying the awareness challenge. For example, the computing device can indicate the action for satisfying the challenge by displaying a prompt of the awareness challenge via one or more output devices.

The awareness computing system can detect whether the operator of the vehicle provides a user input after the response time and whether the user input corresponds to the action for satisfying the awareness challenge. For example, if the action for satisfying the awareness challenge includes pressing a button and the response time is the ten-second mark within the challenge response interval, the awareness computing system can detect the satisfaction of the awareness challenge when the user presses the particular button after the ten-second mark and before the challenge response interval expires.

In response to detecting the user input, prior to the expiration of the challenge response interval, the awareness computing system can reset the awareness challenge. For instance, the awareness computing system can reset the awareness challenge by resetting the soft notification indicative of the awareness challenge. For example, if the soft notification includes a series of five lights, and only three of the five lights are illuminated, the awareness computing system can reset the soft notification by re-illuminating the two dull lights. Additionally, or alternatively, the awareness computing system can reset the awareness challenge by determining one or more new criteria for a new awareness challenge. For instance, to reduce repetition and further prevent workarounds, the awareness computing system can determine a new awareness challenge including one or more distinct criteria in response to resetting the previous challenge. In some implementations, the new criteria for the awareness challenge can be determined based at least in part on the user input. For instance, the challenge response interval can be adjusted based on the timing and/or correctness of the user input. By way of example, if the operator provided user input satisfying the awareness challenge immediately after the response time, the awareness computing system can reward the operator with a longer challenge response interval.

In some implementations, the awareness computing system can communicate, to the operator of the vehicle, a harsh notification indicative of the expiration of the challenge response interval. For instance, the harsh notification can be communicated in response to determining that the operator of the vehicle has not provided the user input before the expiration of the challenge response interval and/or that the user input does not correspond to the action for satisfying the awareness challenge. For example, if the user input provided by the operator does not match an action for satisfying the awareness challenge, or if the user input is provided before the response time, the awareness challenge will continue. In the absence of detecting the user input for satisfying the awareness challenge, after the expiration of the challenge response interval, the awareness computing system can communicate to the operator of the vehicle a harsh notification indicative of the awareness challenge. As noted above, the awareness computing system can reset the awareness challenge at any time prior to or after the expiration of the challenge response interval. In this manner, the awareness computing system can give an operator the opportunity to avoid the harsh notification by providing the correct user input before the expiration of the challenge response interval.

The harsh notification can act as additional encouragement for the operator of the vehicle to satisfy the awareness challenge. In this regard, the harsh notification can differ in severity and form from the soft notification. For example, the soft notification can include the illumination or dulling of a series of lights, while the harsh notification can include an auditory stimulus such as, for example, a sound resembling that of an alarm clock. Moreover, like the soft notification, the harsh notification (e.g., the sound) can correspond to the elapsed time. For example, the harsh notification can include an auditory stimulus that escalates (e.g., in volume, frequency, etc.) in proportion to the elapsed time. Moreover, upon detecting user input that satisfies the awareness challenge, the awareness computing system can reset the harsh notification, for instance, by halting the auditory stimulus.

In some implementations, the awareness challenge can be associated with a safety time threshold. The safety time threshold can be indicative of an amount of elapsed time after the expiration of the challenge response interval. In some implementations, the safety time threshold can be a constant, fixed value for each awareness challenge. In some implementations, the safety time threshold can be different across different awareness challenges (e.g., depending on previous performance of the operator and/or vehicle, the current environment of the vehicle, etc.). As such, the awareness computing system can determine the safety time threshold as a criterion of the awareness challenge.

In the event that the operator does not provide user input that satisfies the awareness challenge before the safety time threshold is reached, an autonomous vehicle can undertake precautionary safety measures. For example, the awareness computing system can be configured to monitor the elapsed time (e.g., from the initiation of the timer, from the expiration of the challenge response interval, etc.) and detect when the elapsed time corresponds to the safety time threshold. Furthermore, in response to detecting that the elapsed time corresponds to the safety time threshold, the awareness computing system can initiate a safety stop routine. By way of example, the safety time threshold for an awareness challenge can be ten seconds after the expiration of the challenge response interval. In the event that the operator of a vehicle continues to ignore the awareness challenge for ten seconds after the expiration of the challenge response interval, the awareness computing system can initiate the safety stop routine. In such a case, the awareness computing system can communicate the harsh notification for ten seconds after the expiration of the awareness challenge. If the operator fails to satisfy the awareness challenge during that ten second period (e.g., by providing the correct user input), the awareness computing system can respond by causing the vehicle to come to a safe stop. This can include autonomously decelerating the vehicle to a stopped position at a safe location (e.g., on the right shoulder of a travel way, a parking space, etc.).

In some implementations, the awareness computing system can generate an operator score for the operator. The operator score can be indicative of a performance of the operator with respect to one or more awareness challenges. For instance, as described herein, the awareness challenge can be based at least in part on the surrounding environment of the autonomous vehicle. By way of example, based on the object data the awareness computing system can generate a question regarding a characteristic of a nearby object (e.g., "what is the color of the car to your right?"). The awareness computing system can provide a prompt to the operator (e.g., an audible output via a speaker), asking this question. The operator can provide user input (e.g., an audible answer) in response to the prompted question.

In some implementations, the awareness computing system can generate an operator score based on a comparison of the user input and the object data. For example, the awareness computing system can receive user input from the operator indicative of an answer to the provided question. In response, the awareness computing system can compare the answer given by the operator with a predicted answer identified by the object data (e.g., the color of the object as identified by the object data). Based on this comparison, the awareness computing system can adjust the operator score associated with the operator. For example, if the answer received from the operator matches the characteristic identified by the object data, the awareness computing system can increase the operator score, whereas the awareness computing system can decrease the operator score in response to an incorrect answer.

In some implementations, the extent to which the awareness computing system adjusts an operator score can be based on a question associated with the prompt of the awareness challenge. For example, the awareness computing system can determine a difficulty level for a question based on the object data (e.g., type of object identified by the objects data, characteristics identified by the object data, etc.) and adjust the operator score in proportion to the difficulty level of the question. For example, the awareness computing system can increase the operator score to a greater degree when the operator provides a correct answer to a question associated with a higher difficulty level as opposed to the operator answering a question associated with a lower difficulty level.

In some implementations, the operator score can identify the aggregate score for each awareness challenge associated with the operator. Moreover, the awareness computing system can determine a rank of the operator in comparison to one or more other operators based at least in part on the operator score. The rank of the operator can be determined in real-time via the awareness computing system and/or the awareness computing system can receive the rank (e.g., information associated with the rank of the operator) from one or more external computing devices. In some implementations, the awareness computing system can, in turn, determine the criteria of an awareness challenge based on the rank of the operator.

In some implementations, the awareness computing system can provide the operator score to the operator via at least one of an output device of an autonomous vehicle or an output device of a user device associated with the operator. For example, the awareness computing system can provide the operator score to the operator in real-time as the operator satisfies one or more awareness challenges. Furthermore, where the awareness computing system determines a rank of the operator, the awareness computing system can provide for display, via a user interface of a display device, data indicative of the rank of the operator in comparison to the other operator(s).

In some implementations, the awareness computing system can store data indicative of the user input, the object data, and data indicative of the operator score in a memory (on board an autonomous vehicle, on one or more external servers, etc.) as part of the operator history associated with the operator. As described above, the awareness computing system can then utilize the operator history to determine one or more criteria of an awareness challenge.

The systems and methods described herein provide a number of technical effects and benefits. More particularly, the systems and methods of the present disclosure provide improved techniques for maintaining vehicle operator awareness in autonomous vehicles. To do so, aspects of the present disclosure allow a computing system to determine and provide a vehicle operator with a variety of awareness challenges configured to stimulate and engage the vehicle operator. Moreover, the computing system avoids the combination of annoying and unnecessary actions by providing both soft and harsh notifications to the vehicle operator. In this way, the present disclosure encourages vehicle operator participation with the correlating effect of increasing vehicle operator alertness, interest, and motivation. In turn, vehicle operators can respond to autonomous vehicle faults or other scenarios more quickly, thereby enhancing public safety.

Example aspects of the present disclosure can provide an improvement to vehicle computing technology, such as autonomous vehicle computing technology. For instance, the systems and methods of the present disclosure provide an improved approach for maintaining vehicle operator awareness. For example, a computing system can determine an awareness challenge having one or more criteria including a challenge response interval, response time, and an action for satisfying the awareness challenge. The computing system can initiate a timer measuring elapsed time from a start time of the challenge response interval. The computing system can communicate, to the operator of the vehicle, a soft notification indicative of the awareness challenge during the challenge response interval. The computing system can detect whether the operator of the vehicle provides a user input after the response time and whether the user input corresponds to the action for satisfying the awareness challenge. Moreover, in response to detecting the user input, prior to an expiration of the challenge response interval, the computing system can reset the awareness challenge. In this manner, a computing system employs a new kind of awareness system that provides a plurality of technical improvements over previous techniques. For instance, the awareness system can strategically tailor each awareness challenge for a particular situation by dynamically determining one or more criteria based on relevant information. Moreover, the awareness system avoids vehicle operator annoyances by employing a soft notification before the expiration of the awareness challenge thereby, allowing an attentive vehicle operator to avoid a harsh notification by resetting the awareness challenge after a response time but before the expiration of the challenge response interval. In addition, the awareness system can accumulate and utilize newly available information about the vehicle or the vehicle operator when determining new criteria for each awareness challenge. For instance, as described herein, the computing system can generate an awareness challenge based at least in part on sensor data associated with the vehicle's surroundings. This can allow the system to leverage existing data (without causing additional data acquisition) to create contextually relevant challenges tailored to the specific circumstances of the vehicle (and the operator). In this way, the awareness system can create new dynamic criteria decreasing a vehicle operator's incentive for developing work arounds while providing an improved ability to test awareness. Ultimately, the computing system provides a solution to real-world problems in roadside safety by maintaining vehicle operator awareness.

With reference now to the FIGS., example aspects of the present disclosure will be discussed in further detail. FIG. 1 illustrates an example vehicle computing system 100 according to example embodiments of the present disclosure. The vehicle computing system 100 can be associated with a vehicle 105. The vehicle computing system 100 can be located onboard (e.g., included on and/or within) the vehicle 105.

The vehicle 105 incorporating the vehicle computing system 100 can be various types of vehicles. The vehicle 105 can be autonomous vehicle. For instance, the vehicle 105 can be a ground-based autonomous vehicle such as an autonomous car, autonomous truck, autonomous bus, etc. The vehicle 105 can be an air-based autonomous vehicle (e.g., airplane, helicopter, or other aircraft) or other types of vehicles (e.g., watercraft, etc.). The vehicle 105 can drive, navigate, operate, etc. with minimal and/or no interaction from a human operator 106 (e.g., driver). An operator 106 (also referred to as a vehicle operator) can be included in the vehicle 105 and/or remote from the vehicle 105. In some implementations, the vehicle 105 can be a non-autonomous vehicle.

In some implementations, the vehicle 105 can be configured to operate in a plurality of operating modes. The vehicle 105 can be configured to operate in a fully autonomous (e.g., self-driving) operating mode in which the vehicle 105 is controllable without user input (e.g., can drive and navigate with no input from a vehicle operator present in the vehicle 105 and/or remote from the vehicle 105). The vehicle 105 can operate in a semi-autonomous operating mode in which the vehicle 105 can operate with some input from a vehicle operator present in the vehicle 105 (and/or a human operator that is remote from the vehicle 105). The vehicle 105 can enter into a manual operating mode in which the vehicle 105 is fully controllable by a vehicle operator (e.g., human driver, pilot, etc.) and can be prohibited and/or disabled (e.g., temporary, permanently, etc.) from performing autonomous navigation (e.g., autonomous driving). In some implementations, the vehicle 105 can implement vehicle operating assistance technology (e.g., collision mitigation system, power assist steering, etc.) while in the manual operating mode to help assist the vehicle operator of the vehicle 105.

The operating modes of the vehicle 105 can be stored in a memory onboard the vehicle 105. For example, the operating modes can be defined by an operating mode data structure (e.g., rule, list, table, etc.) that indicates one or more operating parameters for the vehicle 105, while in the particular operating mode. For example, an operating mode data structure can indicate that the vehicle 105 is to autonomously plan its motion when in the fully autonomous operating mode. The vehicle computing system 100 can access the memory when implementing an operating mode.

The operating mode of the vehicle 105 can be adjusted in a variety of manners. For example, the operating mode of the vehicle 105 can be selected remotely, off-board the vehicle 105. For example, a remote computing system (e.g., of a vehicle provider and/or service entity associated with the vehicle 105) can communicate data to the vehicle 105 instructing the vehicle 105 to enter into, exit from, maintain, etc. an operating mode. For example, in some implementations, the remote computing system can be an operations computing system 195, as disclosed herein. By way of example, such data communicated to a vehicle 105 by the operations computing system 195 can instruct the vehicle 105 to enter into the fully autonomous operating mode. In some implementations, the operating mode of the vehicle 105 can be set onboard and/or near the vehicle 105. For example, the vehicle computing system 100 can automatically determine when and where the vehicle 105 is to enter, change, maintain, etc. a particular operating mode (e.g., without user input). Additionally, or alternatively, the operating mode of the vehicle 105 can be manually selected via one or more interfaces located onboard the vehicle 105 (e.g., key switch, button, etc.) and/or associated with a computing device proximate to the vehicle 105 (e.g., a tablet operated by authorized personnel located near the vehicle 105). In some implementations, the operating mode of the vehicle 105 can be adjusted by manipulating a series of interfaces in a particular order to cause the vehicle 105 to enter into a particular operating mode.

The operations computing system 195 can be any remote device in capable of communicating with the vehicle 105. For example, the operations computing system 195 can transmit signals to the vehicle 105 to control the vehicle 105.

By way of example, a vehicle operator 106 can remotely operate the vehicle 105 via the operations computing system 195. Moreover, the operations computing system can receive data from the vehicle 105. For example, the vehicle 105 can transmit data indicative of a vehicle operator's activity (e.g., performance score, actions, etc.) to the operations computing system 195. In this manner, the operations computing system 195 can enable a supervisor to monitor one or more vehicle operators 106 based on the data received by the operations computing system 195.

The vehicle computing system 100 can include one or more computing devices located onboard the vehicle 105. For example, the computing device(s) can be located on and/or within the vehicle 105. The computing device(s) can include various components for performing various operations and functions. For instance, the computing device(s) can include one or more processors and one or more tangible, non-transitory, computer readable media (e.g., memory devices, etc.). The one or more tangible, non-transitory, computer readable media can store instructions that when executed by the one or more processors cause the vehicle 105 (e.g., its computing system, one or more processors, etc.) to perform operations and functions, such as those described herein for maintaining vehicle operator awareness.

The vehicle 105 can include a communications system 120 configured to allow the vehicle computing system 100 (and its computing device(s)) to communicate with other computing devices. The vehicle computing system 100 can use the communications system 120 to communicate with one or more computing device(s) that are remote from the vehicle 105 over one or more networks (e.g., via one or more wireless signal connections). In some implementations, the communications system 120 can allow communication among one or more of the system(s) on-board the vehicle 105. The communications system 120 can include any suitable components for interfacing with one or more network(s), including, for example, transmitters, receivers, ports, controllers, antennas, and/or other suitable components that can help facilitate communication.

As shown in FIG. 1, the vehicle 105 can include one or more vehicle sensors 125, an autonomy computing system 130, one or more vehicle control systems 135, and other systems, as described herein. One or more of these systems can be configured to communicate with one another via a communication channel. The communication channel can include one or more data buses (e.g., controller area network (CAN)), on-board diagnostics connector (e.g., OBD-II), and/or a combination of wired and/or wireless communication links. The onboard systems can send and/or receive data, messages, signals, etc. amongst one another via the communication channel.

The vehicle sensor(s) 125 can be configured to acquire sensor data 140. This can include sensor data associated with the surrounding environment of the vehicle 105. For instance, the sensor data 140 can acquire image and/or other data within a field of view of one or more of the vehicle sensor(s) 125. The vehicle sensor(s) 125 can include a Light Detection and Ranging (LIDAR) system, a Radio Detection and Ranging (RADAR) system, one or more cameras (e.g., visible spectrum cameras, infrared cameras, etc.), motion sensors, and/or other types of imaging capture devices and/or sensors. The sensor data 140 can include image data, radar data, LIDAR data, and/or other data acquired by the vehicle sensor(s) 125. The vehicle 105 can also include other sensors configured to acquire data associated with the vehicle 105. For example, the vehicle 105 can include inertial measurement unit(s), wheel odometry devices, and/or other sensors.

In some implementations, the sensor data 140 can be indicative of one or more objects within the surrounding environment of the vehicle 105. The object(s) can include, for example, vehicles, pedestrians, bicycles, and/or other objects. The object(s) can be located in front of, to the rear of, to the side of the vehicle 105, etc. The sensor data 140 can be indicative of locations associated with the object(s) within the surrounding environment of the vehicle 105 at one or more times. The vehicle sensor(s) 125 can provide the sensor data 140 to the autonomy computing system 130.

In addition to the sensor data 140, the autonomy computing system 130 can retrieve or otherwise obtain map data 145. The map data 145 can provide information about the surrounding environment of the vehicle 105. In some implementations, an vehicle 105 can obtain detailed map data that provides information regarding: the identity and location of different roadways, road segments, buildings, or other items or objects (e.g., lampposts, crosswalks, curbing, etc.); the location and directions of traffic lanes (e.g., the location and direction of a parking lane, a turning lane, a bicycle lane, or other lanes within a particular roadway or other travel way and/or one or more boundary markings associated therewith); traffic control data (e.g., the location and instructions of signage, traffic lights, or other traffic control devices); the location of obstructions (e.g., roadwork, accidents, etc.); data indicative of events (e.g., scheduled concerts, parades, etc.); and/or any other map data that provides information that assists the vehicle 105 in comprehending and perceiving its surrounding environment and its relationship thereto. In some implementations, the vehicle computing system 100 can determine a vehicle route for the vehicle 105 based at least in part on the map data 145.

The vehicle 105 can include a positioning system 150. The positioning system 150 can determine a current position of the vehicle 105. The positioning system 150 can be any device or circuitry for analyzing the position of the vehicle 105. For example, the positioning system 150 can determine position by using one or more of inertial sensors (e.g., inertial measurement unit(s), etc.), a satellite positioning system, based on IP address, by using triangulation and/or proximity to network access points or other network components (e.g., cellular towers, WiFi access points, etc.) and/or other suitable techniques. The position of the vehicle 105 can be used by various systems of the vehicle computing system 100 and/or provided to a remote computing system. For example, the map data 145 can provide the vehicle 105 relative positions of the elements of a surrounding environment of the vehicle 105. The vehicle 105 can identify its position within the surrounding environment (e.g., across six axes, etc.) based at least in part on the map data 145. For example, the vehicle computing system 100 can process the sensor data 140 (e.g., LIDAR data, camera data, etc.) to match it to a map of the surrounding environment to get an understanding of the vehicle's position within that environment.

The autonomy computing system 130 can include a perception system 155, a prediction system 160, a motion planning system 165, and/or other systems that cooperate to perceive the surrounding environment of the vehicle 105 and determine a motion plan for controlling the motion of the vehicle 105 accordingly. For example, the autonomy computing system 130 can obtain the sensor data 140 from the vehicle sensor(s) 125, process the sensor data 140 (and/or other data) to perceive its surrounding environment, predict the motion of objects within the surrounding environment, and generate an appropriate motion plan through such surrounding environment. The autonomy computing system 130 can communicate with the one or more vehicle control systems 135 to operate the vehicle 105 according to the motion plan.

The vehicle computing system 100 (e.g., the autonomy computing system 130) can identify one or more objects that are proximate to the vehicle 105 based at least in part on the sensor data 140 and/or the map data 145. For example, the vehicle computing system 100 (e.g., the perception system 155) can process the sensor data 140, the map data 145, etc. to obtain perception data 170. The vehicle computing system 100 can generate perception data 170 that is indicative of one or more states (e.g., current and/or past state(s)) of a plurality of objects that are within a surrounding environment of the vehicle 105. For example, the perception data 170 for each object can describe (e.g., for a given time, time period) an estimate of the object's: current and/or past location (also referred to as position); current and/or past speed/velocity; current and/or past acceleration; current and/or past heading; current and/or past orientation; size/footprint (e.g., as represented by a bounding shape); class (e.g., pedestrian class vs. vehicle class vs. bicycle class), the uncertainties associated therewith, and/or other state information. The perception system 155 can provide the perception data 170 to the prediction system 160, the motion planning system 165, the awareness computing system 185, and/or other system(s).

The prediction system 160 can be configured to predict a motion of the object(s) within the surrounding environment of the vehicle 105. For instance, the prediction system 160 can generate prediction data 175 associated with such object(s). The prediction data 175 can be indicative of one or more predicted future locations of each respective object. For example, the prediction system 160 can determine a predicted motion trajectory along which a respective object is predicted to travel over time. A predicted motion trajectory can be indicative of a path that the object is predicted to traverse and an associated timing with which the object is predicted to travel along the path. The predicted path can include and/or be made up of a plurality of way points. In some implementations, the prediction data 175 can be indicative of the speed and/or acceleration at which the respective object is predicted to travel along its associated predicted motion trajectory. The prediction system 160 can output the prediction data 175 (e.g., indicative of one or more of the predicted motion trajectories) to the motion planning system 165.

The vehicle computing system 100 (e.g., the motion planning system 165) can determine a motion plan 180 for the vehicle 105 based at least in part on the perception data 170, the prediction data 175, and/or other data. A motion plan 180 can include vehicle actions (e.g., planned vehicle trajectories, speed(s), acceleration(s), other actions, etc.) with respect to one or more of the objects within the surrounding environment of the vehicle 105 as well as the objects' predicted movements. For instance, the motion planning system 165 can implement an optimization algorithm, model, etc. that considers cost data associated with a vehicle action as well as other objective functions (e.g., cost functions based on speed limits, traffic lights, etc.), if any, to determine optimized variables that make up the motion plan 180. The motion planning system 165 can determine that the vehicle 105 can perform a certain action (e.g., pass an object, etc.) without increasing the potential risk to the vehicle 105 and/or violating any traffic laws (e.g., speed limits, lane boundaries, signage, etc.). For instance, the motion planning system 165 can evaluate one or more of the predicted motion trajectories of one or more objects during its cost data analysis as it determines an optimized vehicle trajectory through the surrounding environment. The motion planning system 165 can generate cost data associated with such trajectories. In some implementations, one or more of the predicted motion trajectories may not ultimately change the motion of the vehicle 105 (e.g., due to an overriding factor). In some implementations, the motion plan 180 may define the vehicle's motion such that the vehicle 105 avoids the object(s), reduces speed to give more leeway to one or more of the object(s), proceeds cautiously, performs a stopping action, etc.

The motion planning system 165 can be configured to continuously update the vehicle's motion plan 180 and a corresponding planned vehicle motion trajectory. For example, in some implementations, the motion planning system 165 can generate new motion plan(s) for the vehicle 105 (e.g., multiple times per second). Each new motion plan can describe a motion of the vehicle 105 over the next planning period (e.g., next several seconds). Moreover, a new motion plan may include a new planned vehicle motion trajectory. Thus, in some implementations, the motion planning system 165 can continuously operate to revise or otherwise generate a short-term motion plan based on the currently available data. Once the optimization planner has identified the optimal motion plan (or some other iterative break occurs), the optimal motion plan (and the planned motion trajectory) can be selected and executed by the vehicle 105.

The vehicle computing system 100 can cause the vehicle 105 to initiate a motion control in accordance with at least a portion of the motion plan 180. A motion control can be an operation, action, etc. that is associated with controlling the motion of the vehicle. For instance, the motion plan 180 can be provided to the vehicle control system(s) 135 of the vehicle 105. The vehicle control system(s) 135 can be associated with a vehicle controller (e.g., including a vehicle interface) that is configured to implement the motion plan 180. The vehicle controller can, for example, translate the motion plan into instructions for the appropriate vehicle control component (e.g., acceleration control, brake control, steering control, etc.). By way of example, the vehicle controller can translate a determined motion plan 180 into instructions to adjust the steering of the vehicle 105 "X" degrees, apply a certain magnitude of braking force, etc. The vehicle controller (e.g., the vehicle interface) can help facilitate the responsible vehicle control (e.g., braking control system, steering control system, acceleration control system, etc.) to execute the instructions and implement the motion plan 180 (e.g., by sending control signal(s), making the translated plan available, etc.). This can allow the vehicle 105 to autonomously travel within the vehicle's surrounding environment.

As shown in FIG. 1, the vehicle 105 can include an HMI ("Human Machine Interface") 190 that can output data and accept input from the operator 106 of the vehicle 105. For instance, the HMI 190 can include one or more output devices such as speakers, display devices, tactile devices, etc. As discussed in further detail below, the HMI 190 can provide one or more informational prompts 245 (shown in FIG. 2) to the operator 106 of the vehicle 105. Additionally, or alternatively, the HMI 190 can include one or more input devices such as buttons, microphones, cameras, etc. As discussed in further detail below, in some implementations, the HMI 190 can accept user input in the form of one of more actions 240 for satisfying an awareness challenge.

The vehicle computing system 100 can include an awareness computing system 185. The awareness computing system 185 can determine and provide an awareness challenge to maintain vehicle operator awareness, as described in greater detail herein. In some implementations, the awareness computing system 185 can be configured to operate in conjunction with the vehicle autonomy system 130. For example, the awareness computing system 185 can send data to and receive data from the vehicle autonomy system 130. In some implementations, the awareness computing system 185 can be included in or otherwise a part of a vehicle autonomy system 130. The awareness computing system 185 can include software and hardware configured to provide the functionality described herein. In some implementations, the awareness computing system 185 can be implemented as a subsystem of a vehicle computing system 100. Additionally, or alternatively, the awareness computing system 185 can be implemented via one or more computing devices that are remote from the vehicle 105. Example awareness computing system 185 configurations according to example aspects of the present disclosure are discussed in greater detail with respect to FIGS. 2-9.

The operator 106 can be associated with the vehicle 105 to take manual control of the vehicle, if necessary. For instance, in a testing scenario, a vehicle 105 can be periodically tested with controlled faults that can be injected into an autonomous vehicle's autonomy system 130. This can help the vehicle's response to certain scenarios. A vehicle operator 106 can be located within the vehicle 105 and/or remote from the vehicle 105 to take control of the vehicle 105 (e.g., in the event the fault results in the vehicle exiting from a fully autonomous mode in the testing environment).

Although many examples are described herein with respect to autonomous vehicles, the disclosed technology is not limited to autonomous vehicles. Any vehicle may utilize the technology described herein for maintaining operator awareness. For example, a non-autonomous vehicle may utilize aspects of the present disclosure to develop awareness challenges for an operator of the non-autonomous vehicle, prompt the vehicle operator to respond in accordance with the awareness challenge, and obtain an associated response.

Figure 2:
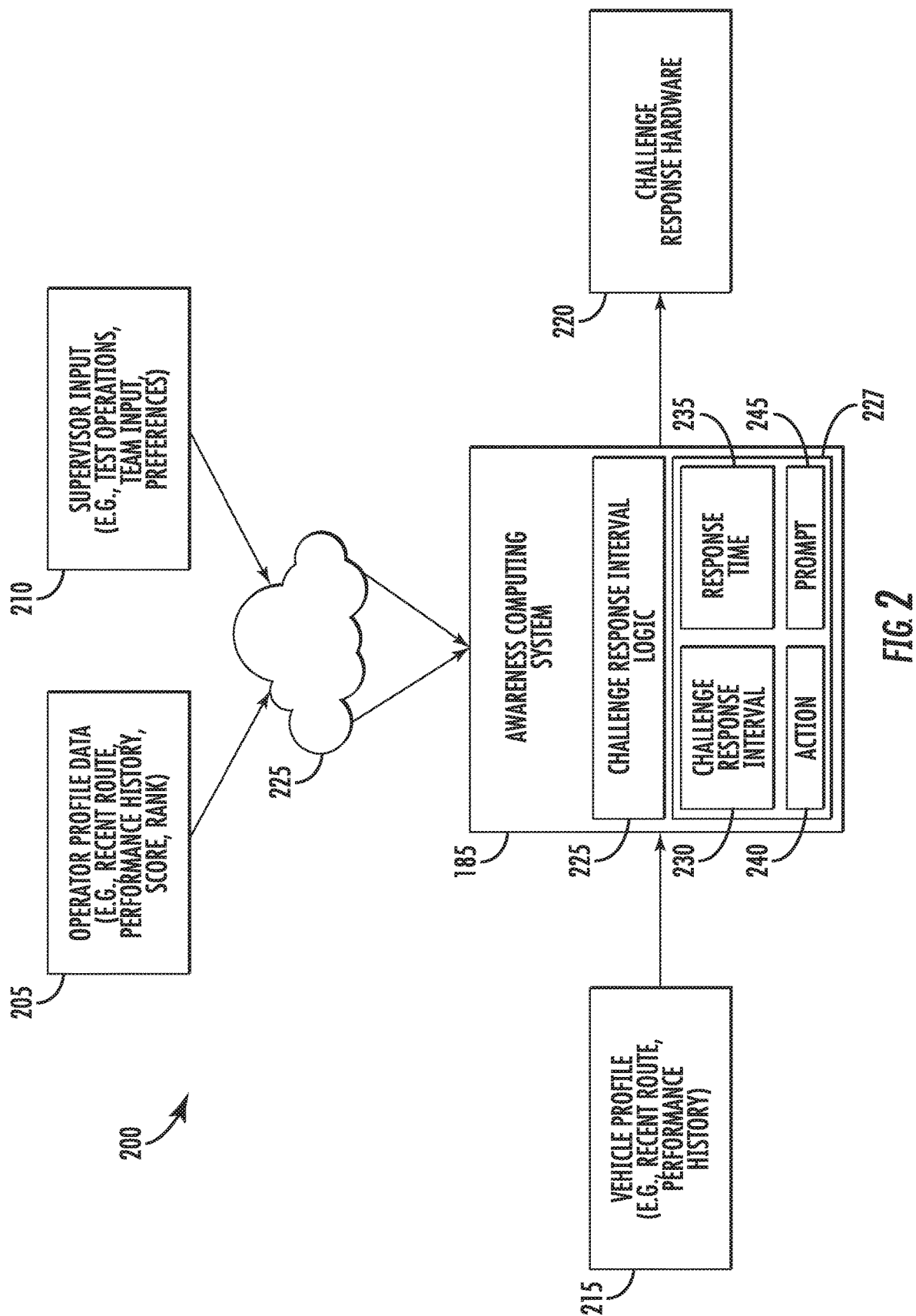
FIG. 2 depicts an example network diagram for determining criteria of an awareness challenge according to example implementations of the present disclosure.

FIG. 2 depicts an example network diagram 200 for determining an awareness challenge having one or more criteria according to example embodiments of the present disclosure. The awareness computing system 185 can generate an awareness challenge for a vehicle operator 106 to maintain vehicle operator awareness. In some implementations, the awareness computing system 185 can include a challenge response interval logic 225. The awareness computing system 185 can leverage data from the challenge response interval logic 225 to optimize awareness challenges. For instance, the challenge response interval logic 225 can include one or more sets of rules to better tailor an awareness challenge to a particular scenario and/or vehicle operator 106. By way of example, the one or more sets of rules can specify one or more data sets specific to a particular scenario and/or vehicle operator 106. In some implementations, the set of rules can be predetermined. While in other implementations, the challenge response interval logic 225 can incorporate different sets of rules depending on performance. For example, if a first set of rules correlates with better results than a second set of rules, the challenge response interval logic 225 can replace the second set of rules with the first set of rules. In this way, the challenge response interval logic 225 can be configured to provide optimized rule sets over time.

The awareness computing system 185 can determine an awareness challenge 227 having one or more criteria for the operator 106 of a vehicle 105. The one or more criteria can include a challenge response interval 230 indicative of a first period of time for the operator 106 of the vehicle 105 to complete the awareness challenge 227, a response time 235 within the first period of time, an action 240 for satisfying the awareness challenge 227, and a prompt 245 indicative of a request for the action 240 for satisfying the awareness challenge 227. As discussed herein, each of the values for the one or more criteria may vary depending one or more factors, such as, for example, past awareness challenges. In this manner, the awareness computing system 185 can dynamically determine the one or more criteria for the awareness challenge 227 to improve the vehicle operator's alertness, interest, and motivation, while reducing the vehicle operator's incentive for developing harmful workarounds.

As discussed in greater detail with reference to FIG. 3, the challenge response interval 230 and the response time 235 identify timing values associated with an awareness challenge 227. Ultimately, the challenge response interval 230 can be indicative of a first period of time for the operator 106 of a vehicle 105 to complete the awareness challenge and the response time 235 can be a point in time after which the vehicle operator can provide a response to a prompt 240 of an awareness challenge. Thus, the challenge response interval 230 establishes an initial time period within which the operator 106 can satisfy the awareness challenge 227 and the response time 235 identifies the initial opportunity for an operator 106 to satisfy the awareness challenge 227. For example, the response time 235 can be a point in time after which the vehicle operator 106 can provide a response to the prompt 240 of an awareness challenge 227.

Figure 5:
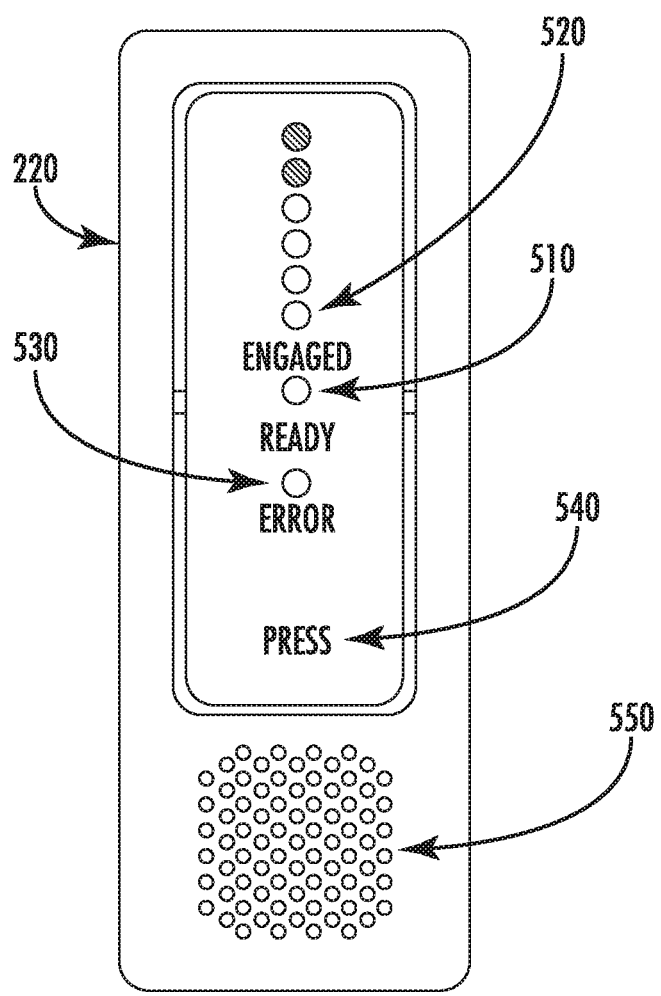
FIG. 5 depicts an example awareness challenge hardware device according to example implementations of the present disclosure.

As discussed in greater detail with respect to FIG. 5, an action 240 for satisfying the awareness challenge 227 can include a task to be performed by the operator 106 of the vehicle 105. For example, an action 240 for satisfying the awareness challenge 227 can include specific tasks selected to improve the vehicle operator's attention, such as a specific button press, touch screen action, verbal acknowledgement, gesture, etc. In some implementations, an action 240 for satisfying the awareness challenge 227 can include a plurality of tasks. For instance, an action 240 can indicate a specific sequence of one or more tasks to be performed by the operator 106 (e.g., button press and verbal acknowledgement).

As discussed in greater detail with respect to FIG. 5, a prompt 245 of the awareness challenge 227 can be a request for the action 240 for satisfying the challenge. For instance, the awareness computing system 185 can provide the prompt 245 of the awareness challenge 227 to an operator 106 of a vehicle 105 via the challenge response hardware 220 to indicate to the operator 106 the correct action 240 for satisfying the awareness challenge 227. For example, the awareness computing system 185 can (visually, audibly, tactilely, etc.) output a prompt 245 indicating to the operator 106 of the vehicle 105 that the specific task of pressing a particular button after the response time 235 can satisfy the awareness challenge 227. In another example, the prompt 245 can include a question and the action 240 for satisfying the awareness challenge can include the answer to that question.

Figure 4:
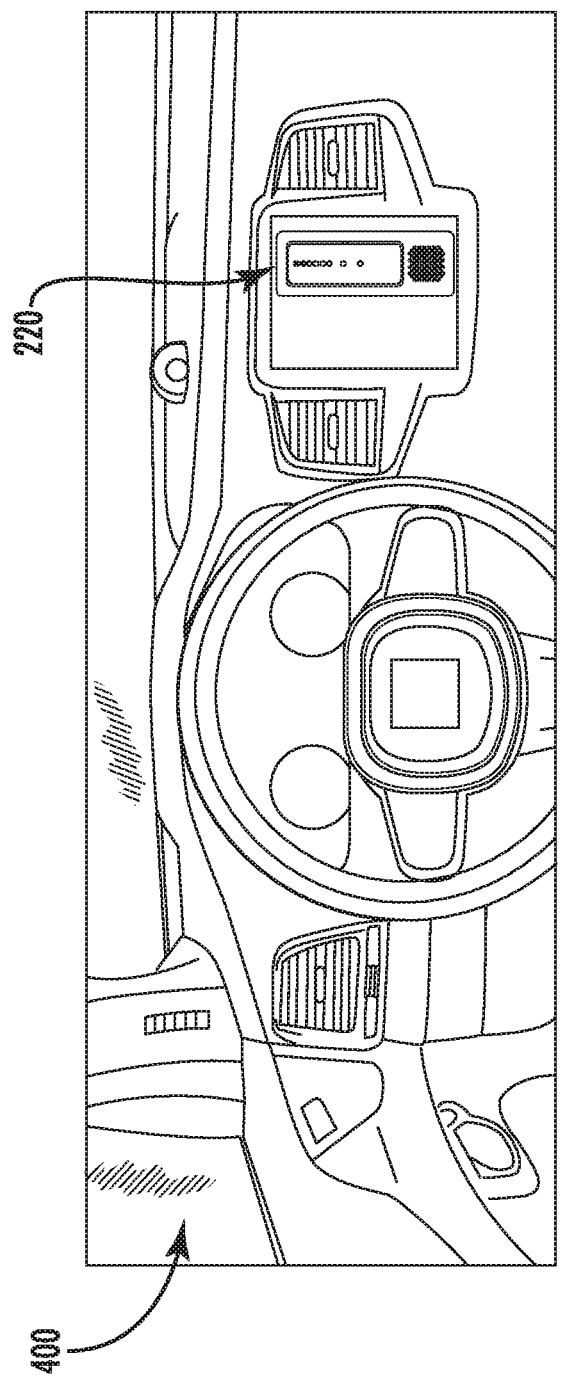
FIG. 4 depicts an example vehicle interior according to example implementations of the present disclosure.

As discussed in greater detail with respect to FIGS. 4-5, the awareness computing system 185 can communicate with the operator 106 via challenge response hardware 220. For example, the challenge response hardware 220 can include one or more output devices configured to provide one or more prompt(s) 245, notification etc. to the operator 106 of a vehicle 105. Additionally, or alternatively, the challenge response hardware 220 can include one or more input devices configured to detect user input indication of an action 240 for satisfying an awareness challenge 227. Moreover, as discussed in greater detail with respect to FIG. 3, the challenge response hardware 220 can include one or more timing mechanism(s) for measuring elapsed time from a start time of the challenge response interval 230.

The awareness computing system 185 can optimize awareness challenges by leveraging one or more sets of data, such as operator profile data 205, supervisor input data 210, and vehicle profile data 215. Each data set can provide wholistic data focused on the operator, supervisor, or vehicle respectively. By leveraging the one or more of the data sets, the awareness computing system 185 can offer the unique ability to specifically tailor awareness challenges to at least one of the operator, supervisor, and/or vehicle.

In some implementations, at least one of the criteria of the awareness challenge 227 can be associated with the vehicle operator 106. For example, the criteria of the awareness challenge 227 can be based at least in part on the vehicle operator 106 as indicated by the operator profile data 205 (e.g., stored onboard the vehicle 105 or in one or more external servers). The operator profile data 205 can include any data associated with the operator 106 of the vehicle 105 such as, for example, operator demographics, relative location (e.g., inside the vehicle, outside the vehicle, etc.), geographic location, operator tendencies, operator history, etc. Such data can be acquired via permission of the operator 105.

For example, the awareness computing system 185 can determine the criteria of the awareness challenge 227 based on an operator history associated with the operator 106 of the vehicle 105. Operator history data can indicate, for example, how well the operator 106 has responded to previous awareness challenges. For instance, the awareness computing system 185 can determine a response time 235 closer to the end of the challenge response interval 230 (e.g., response time 235 of 25 seconds within an interval 230 of thirty seconds) when the operator history indicates that the operator 106 has responded quickly and/or correctly in the past. In this manner, the awareness computing system 185 can avoid operator complacency by continually decreasing the time between the response time 235 and the expiration of the challenge response interval 230 (e.g., at 320), thereby increasing the difficulty of satisfying the awareness challenge before its expiration (e.g., at 320).

The awareness computing system 185 can monitor operator performance over time. For example, the awareness computing system 185 can receive data indicative of the operator's performance (e.g., response time) for each awareness challenge. In some implementations, the awareness computing system 185 can store operator performance data with the operator profile data 205 (e.g., in an operator history). In this manner, the operator profile data 205 can change, increase, be modified, etc. as the operator completes awareness challenges.

Moreover, in some implementations, the awareness computing system 185 can supplement the operator profile data 205 with an operator score and/or operator rank. For example, the awareness computing system 185 can generate an operator score for the operator 106 and store the operator score in the operator history associated with the operator profile data 205. The operator score can be indicative of a performance of the operator 106 with respect to one or more awareness challenges. For example, in some implementations, the operator score can identify the aggregate score for each awareness challenge associated with the operator 106. In some implementations, the challenge response interval 230 can be associated with an operator score associated with the vehicle operator 106. For instance, the challenge response interval 230 can be shortened or lengthened based on the operator score (e.g., longer for higher score, shorter for lower score, vice versa).

Additionally, or alternatively, the awareness computing system 185 can determine a rank of the operator 106 in comparison to one or more other operators based at least in part on the operator score. In some implementations, at least one of the score or the rank of the operator 106 can be determined in real-time via the awareness computing system 185. In other implementations, the awareness computing system 185 can receive at least one of the score or the rank (e.g., information associated with the rank of the operator 106) from one or more external computing devices such as the operations computing system 195. The awareness computing system 185 can store data indicative of at least one of the operator score and/or rank in a memory (on board an vehicle 105, on one or more external servers, etc.) as part of the operator history associated with the operator profile data 205. The awareness computing system 185 can determine the criteria of an awareness challenge based on the rank of the operator.

In some implementations, at least one of the criteria of the awareness challenge can be based, at least in part, on supervisor input 210. For instance, in some implementations, a supervisor can oversee (e.g., via the operations computing system 195) one or more operators of a plurality of vehicles. For example, the awareness computing system 185 can output data, via a network 225, indicative of the performance of one or more operators to one or more remote computing devices such as the operations computing system 195. In such a case, the supervisor can monitor the performance data (e.g., via one or more output devices of the operations computing system 195) to oversee the operator(s). Based on the performance data, the supervisor can transmit (e.g., via the operations computing device 195 over the network 225) supervisor input 210 indicating a desired change to one or more criteria of an awareness challenge 227 (e.g., a longer challenge response interval 230 to reward high performance) to the awareness computing system 185. In response, the awareness computing system 185 can accept the supervisor input 210 and, based (at least in part) on the supervisor input 210 determine the criteria of the awareness challenge (e.g., determine a longer challenge response interval, adjust the frequency of the awareness challenges, etc.).

Additionally, or alternatively, the awareness computing system 185 can receive generalized supervisor input from the supervisor input data 210. For example, a supervisor can determine one or more weekly goals, objectives, incentives, etc. that can affect an awareness challenge 227. For instance, a supervisor can create a weekly incentive for one or more operators to compete to record the fastest response time. In this instance, the awareness computing system 185 can update the criteria of an awareness challenge 227 to facilitate the incentive (e.g., determining an earlier response time 235).

In some implementations, the awareness computing system 185 can determine one or more criteria of an awareness challenge based, at least in part, on vehicle profile data 215. The vehicle profile 215 data can include data such as, for example, sensor data 140, motion plan data 180, perception data 170, prediction data 175, navigation route data, performance data, and/or other data associated with a vehicle 105

For example, at least one of the criteria of the awareness challenge can be associated with at least one of a navigation route associated with the vehicle 105 and/or a motion plan 180 associated with an vehicle 105. In some implementations, data indicative of the navigation route and/or motion plan 180 is determined by the vehicle and stored in memory onboard the vehicle 105. Additionally, or alternatively, navigation and/or motion plan data 180 can be determined and stored by another device (e.g., a memory that is external to the vehicle 105). For instance, in some cases, the navigation and/or motion plan data can be determined by one or more external computing devices and transmitted to the awareness computing system 185 over network(s) 225.

By way of example, the awareness computing system 185 can determine longer (e.g., in high stimulus environments), and/or shorter (e.g., in low stimulus environments) challenge response intervals 230 based at least in part on at least one of the navigation route and/or motion plan 180. For example, the awareness computing system 185 can determine a longer challenge response interval 230 where the navigation route and/or motion plan indicate a high stimulus environment (e.g., rocky terrains, curvy roads, irregular scenery, etc.), so as not to distract the operator 106. In another example, the awareness computing system 185 can determine a shorter challenge response interval 230 where the navigation route and/or motion plan data 180 indicate a low stimulus environment (e.g., highways, familiarized scenery, etc.). In this manner, the awareness computing system 185 can strategically determine criteria of an awareness challenge 227 based on the anticipated additional stimulus from a navigation route and/or motion plan 180.

In some implementations, where the vehicle 105 is an autonomous vehicle 105, at least one of the criteria of the awareness challenge 227 can be associated with a performance associated with the autonomous vehicle. For instance, the awareness computing system 185 can determine the criteria of the awareness challenge 227 based at least in part on the stage of development of a software package being tested on the vehicle 105 in a controlled environment. If the software package is being tested for a first time and/or an early version of the software is being tested (e.g., a first/initial version, etc.), the awareness computing system 185 can determine a shorter challenge response interval designed to increase the operator's awareness. The awareness computing system 185 can determine a longer challenge response interval where the software package has been tested a number of times and/or has been developed across several versions. In this manner, the awareness computing system 185 can modify the intended awareness of an operator 106 based on the predictability of the performance of the vehicle 105 (e.g., when testing software within a controlled testing environment).

Figure 6:
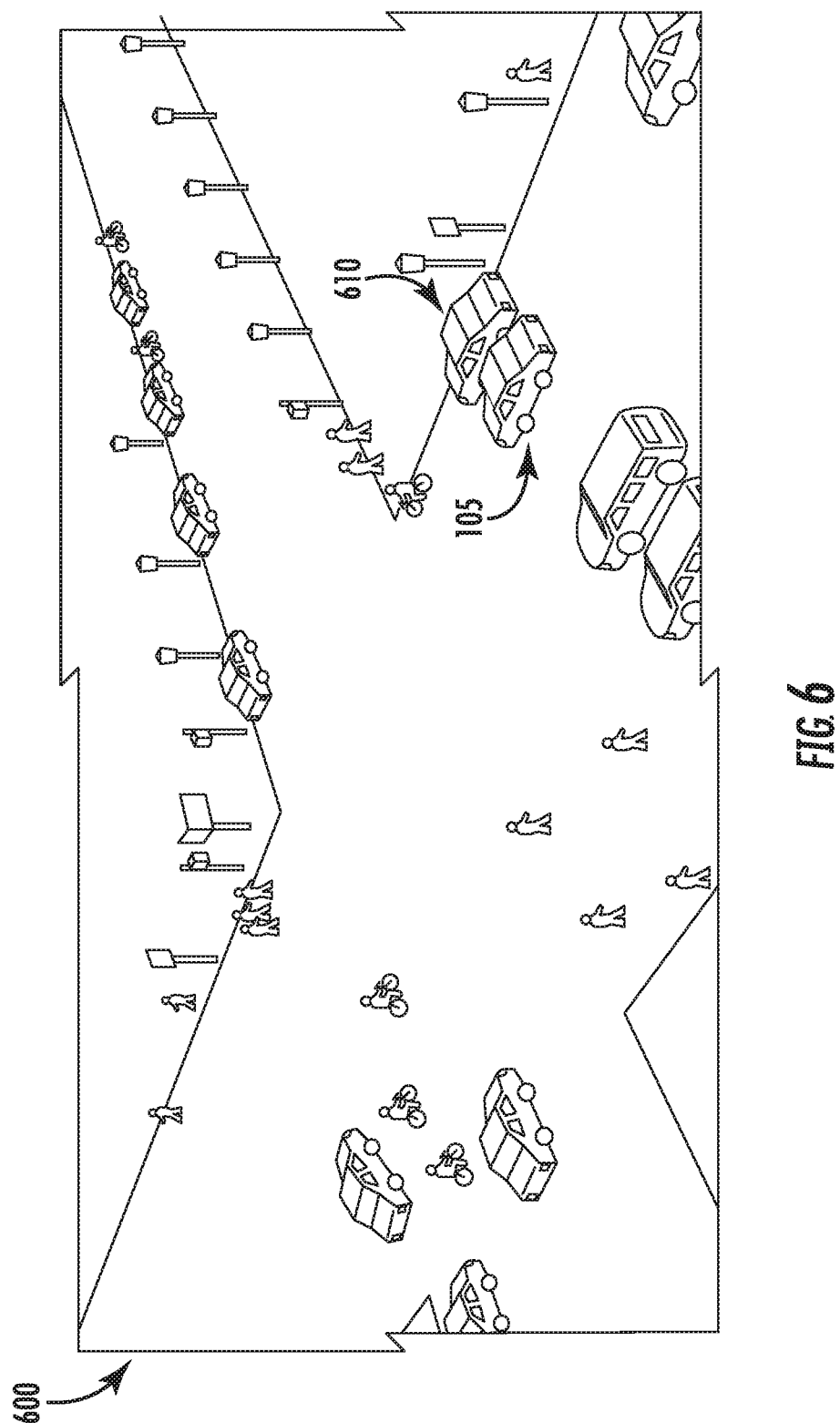
FIG. 6 depicts an example portion of a geographic area according to example implementations of the present disclosure.

In some implementations, the awareness computing system 185 can determine an awareness challenge 227 based at least in part on sensor data 140. For example, the awareness computing system 185 can generate the prompt 245 of the awareness challenge 227 based on a vehicle's surrounding environment. FIG. 6 depicts an example portion of geographical area that makes up at least a portion of the surrounding environment 600 of a vehicle 105 according to example embodiments of the present disclosure. The awareness computing system 185 can obtain sensor data 140 associated with the surrounding environment 600 of the vehicle 105 (e.g., via one or more of the vehicle sensors 125). The awareness computing system 185 can determine object data associated with one or more objects (e.g., sign posts, vehicles, pedestrians, etc.) within the surrounding environment 600 based at least in part on the sensor data 140. For example, the object data can be similar to, include at least a portion of, or be the same as the perception data 170 determined by a vehicle's autonomy computing system 130. In some implementations, the object data can be indicative of one or more characteristics (e.g., color, size, type, location, etc.) associated with each of the one or more objects. For example, the object data can identify information about a nearby vehicle 610 such as the color of vehicle 610, position relative to the vehicle 105, and/or any other identifying characteristics associated with vehicle 610.

In some implementations, the awareness computing system 185 can generate an awareness challenge 227 based, at least in part, on the object data, perception data 170, etc. For instance, the awareness challenge can include a prompt 245 that is based at least in part on the object data. By way of example, the prompt 245 can be include one or more questions based at least in part on the object data. The questions can be associated with, for example, at least one characteristic of an object (e.g., vehicle 610) within the surrounding environment 600 of the vehicle 105. For example, the prompt 245 can include a question that asks: "What is the color of the car to your right" (e.g., referring to vehicle 610). Additionally, or alternatively, the question(s) can be associated with at least one of a type and/or a location of the object (e.g., vehicle 610) within the surrounding environment 600 of the vehicle 105. The prompt 245 can inform the operator 106 that the answer to the question(s) can satisfy the awareness challenge 227.

The awareness computing system 185 can provide the prompt 245 of the awareness challenge to an operator of the vehicle 105. For instance, the awareness computing system 185 can output an audible communication indicative of the prompt 245 (e.g., via one or more output devices of the challenge response hardware 220 (e.g., speakers) and/or the HMI 190). The awareness computing system 185 can obtain (e.g., via the HMI, challenge response hardware, etc.) data indicative of a user input (e.g., an answer) in response to the prompt 245. For instance, the awareness computing system 185 can obtain from the operator 106, data indicative of one or more answers to the one or more questions of the awareness challenge 227. By way of example, when a prompt 245 requests the operator 106 of the vehicle to identify the color of the nearby vehicle 610, the operator can provide user input indicative of the color of vehicle 610 (e.g., "blue," "green," etc.).

The awareness computing system 185 can further supplement the operator profile data 205 by generating the operator score, described above, based, at least in part, on a comparison of the user input and the object data. For instance, the awareness computing system 185 can obtain data indicative of a user input in response to the prompt 245 of the awareness challenge 227. The awareness computing system can determine whether the user input satisfies the awareness challenge 227 based at least in part on a comparison of the user input and the object data. In some implementations, the awareness computing system 185 can generate an operator score based on the comparison of the user input and the object data. Additionally, or alternatively, determining a rank of the operator 106 in comparison to one or more other operators based at least in part on the operator score, as described herein.

By way of example, the awareness computing system 185 can receive user input from the operator 106 indicative of an answer to the provided question. In response, the awareness computing system 185 can compare the answer given by the operator 106 with a predicted answer identified by the object data (e.g., the color of the object as identified by the object data). Based on this comparison, the awareness computing system 185 can adjust the operator score associated with the operator 106. For example, if the answer received from the operator matches the characteristic identified by the object data, the awareness computing system 185 can increase the operator score, whereas the awareness computing system 185 can decrease the operator score in response to an incorrect answer. The awareness computing system 185 can determine the rank of the operator 106 (in comparison to other operator(s)) based at least in part on the updated operator score.

In some implementations, the extent to which the awareness computing system 185 adjusts the operator score can be based on a question associated with the prompt 245 of the awareness challenge. For example, a computing device (e.g., the awareness computing system 185, the operations computing system etc.) can determine a difficulty level for a question based on the object data (e.g., type of object identified by the objects data, characteristics identified by the object data, etc.) and adjust the operator score in proportion to the difficulty level of the question. For example, the difficultly level can be based on factors such as relative success rate, whereby a question with a low success rate (e.g., large number of incorrect answers) can be associated with a higher difficulty level. In this manner, the awareness computing system 185 can increase the operator score to a greater degree when the operator 106 provides a correct answer to a question associated with a higher difficulty level as opposed to the operator 106 answering a question associated with a lower difficulty level.

In some implementations, at least one of the criteria of the awareness challenge 227 can be randomized. For instance, the awareness computing system 185, or any other computing device, can, in some implementations, predetermine a series of values for each of the criteria of the awareness challenge 227. For example, in some implementations, the awareness computing system 185 can generate a series of values for each of the criteria of the awareness challenge and store the vales in a memory onboard the vehicle. In other implementations, one or more remote computing systems remotely located from the vehicle 105 can generate the series of values for each of the criteria of the awareness challenge 227. In this case, the awareness computing system 185 can receive the predetermined series of values from the one or more remote computing systems and store the values in local memory and/or receive the one of more values from a remote memory.

The awareness computing system 185 can determine the criteria for an awareness challenge 227 by iteratively selecting one or more of the predetermined values at random. For example, the awareness computing system 185 can randomly (e.g., via a random number generator, etc.) select a value for the challenge response interval 230 from the predetermined series of values. The awareness computing system 185 can then randomly select a value for the response time 235 from the predetermined series of values based in part on the selected challenge response interval 230 (e.g., by using the challenge response interval 230 as an upper bound). In this manner, the awareness computing system 185 can randomize the one or more criteria of an awareness challenge 227.

FIG. 3 depicts an example awareness challenge time line 300 according to example embodiments of the present disclosure. As described herein, the one or more criteria of an awareness challenge 227 can include a challenge response interval 230 indicative of a first period of time for the operator 106 of a vehicle 105 to complete the awareness challenge 227 and a response time 235 within the first period of time. The challenge response interval 230 can include any unit for period of time including increments of as seconds, minutes, etc. If the awareness challenge is not satisfied before the expiration of the challenge response interval 230 (e.g., at time 320), the awareness computing system 185 can employ additional measures to encourage an operator to satisfy the awareness challenge 227.

In some implementations, the awareness challenge 227 can include a response time interval 340 indicative of a second period of time less than the challenge response interval 230 within which the operator 106 of the vehicle 105 cannot satisfy the awareness challenge 227. For example, where the challenge response interval 230 is thirty seconds, the response time 235 can indicate a ten-second mark within the thirty-second interval with the response time interval 340 being the ten seconds from the start time 310 to the response time 235 (e.g., indicative of the end response time interval 340). In such a case, the operator 106 cannot satisfy the awareness challenge 227 until after the ten-second mark of the response time interval 340. In this manner, the awareness computing system 185 can prohibit the operator 106 from satisfying the awareness challenge 227 for a portion of the challenge response interval 230 effectively extending the operator's awareness for at least that portion by removing workarounds.

The awareness computing system 185 can initiate a timer (e.g., the timing mechanism of the challenge response hardware 220) measuring elapsed time from a start time 310 of the challenge response interval 230. For example, if the challenge response interval 230 indicates thirty seconds, the timer can measure the elapsed time from time 310 (e.g., t=0) and the challenge response interval 230 can expire when the elapsed time reaches time 320 (e.g., t=30 s).

As discussed in greater detail with reference to FIGS. 4-5, the awareness computing system 185 can communicate (e.g., via the challenge response hardware 220, the HMI 190, etc.), to the operator 106 of the vehicle 105, a soft notification indicative of the challenge response interval 230. In some implementations, the awareness computing system 185 can communicate to the operator 106 of the vehicle 105 the soft notification 520 as time elapses. For example, the challenge response hardware 220 can provide a distinct soft notification 520 based on the elapsed time.

Returning to FIG. 2, in some implementations, the awareness computing system 185 can provide (e.g., visually, tactilely, audibly, etc.) one or more criteria of the awareness challenge to the operator 106 (e.g., via the challenge response hardware 220, the HMI 190, etc.). For example, the challenge response hardware 220 can provide data indicate of the challenge response interval 230, response time 235, and/or the prompt 245 requesting the action for satisfying the awareness challenge 227. For instance, the challenge response hardware 220 can indicate the action 240 for satisfying the challenge by displaying a prompt 245 of the awareness challenge via one or more output devices.

The awareness computing system 185 can detect whether the operator of the vehicle provides a user input after the response time 235 and whether the user input corresponds to the action 240 for satisfying the awareness challenge. For example, if the action 240 for satisfying the awareness challenge includes pressing a button and the response time 235 is at the ten-second mark within the challenge response interval 230, the awareness computing system 185 can detect the satisfaction of the awareness challenge when the user presses the particular button after the ten-second mark 235 and before the challenge response interval 230 expires (e.g., at time 320).

In response to detecting the user input, prior to the expiration of the challenge response interval 230 (e.g., at 320) the awareness computing system 185 can reset the awareness challenge 227. For instance, the awareness computing system 185 can reset the awareness challenge 227 by resetting the soft notification indicative of the awareness challenge 227. For example, if the soft notification includes a series of five lights, and only three of the five lights are illuminated, the awareness computing system 185 can reset the soft notification by re-illuminating the two dull lights. Additionally, or alternatively, the awareness computing system 185 can reset the awareness challenge 227 by determining one or more new criteria for a new awareness challenge. For instance, to reduce repetition and further prevent workarounds, the awareness computing system 185 can determine a new awareness challenge including distinct criteria in response to resetting the previous challenge. In some implementations, one or more of the new criteria for the new awareness challenge can be determined based at least in part on the user input. For instance, the challenge response interval 230 can be adjusted based at least in part on the timing and/or correctness of the user input. By way of example, if the operator provided user input satisfying the awareness challenge immediately after the response time 235, the awareness computing system 185 can reward the operator with a longer challenge response interval 230.

In some implementations, the awareness computing system 185 can communicate, to the operator 106 of the vehicle 105, a harsh notification indicative of the expiration of the challenge response interval 230 (e.g., at time 320). For instance, the harsh notification can be communicated in response to determining that the operator 106 of the vehicle 105 has not provided the user input before the expiration of the challenge response interval 230 (e.g., at time 320) and/or that the user input does not correspond to the action 240 for satisfying the awareness challenge 227. For example, if the user input provided by the operator 106 does not match an action 240 for satisfying the awareness challenge 227, or if the user input is provided before the response time 235, the awareness challenge 227 will continue. In the absence of detecting the user input for satisfying the awareness challenge 227, after the expiration of the challenge response interval 230 (e.g., at 320), the awareness computing system 185 can communicate to the operator 106 of the vehicle 105 a harsh notification indicative of the awareness challenge 227. As noted above, the awareness computing system 185 can reset the awareness challenge 227 at any time prior to or after the expiration of the challenge response interval 230 (e.g., at time 320). In this manner, the awareness computing system 185 can give an operator 106 the opportunity to avoid the harsh notification by providing the correct user input before the expiration of the challenge response interval 230 (e.g., at time 320).

With reference to FIG. 3, the awareness challenge 227 can be associated with a safety time threshold 350 indicative of a period of time after the expiration of the challenge response interval 230 (e.g., after time 320). The safety time threshold 350 can be indicative of any amount of elapsed time after the expiration of the challenge response interval 230 (e.g., after 320). In some implementations, the safety time threshold 350 can be a constant, fixed value for each awareness challenge. In other implementations, the safety time threshold 350 can be different across different awareness challenges (e.g., depending on previous performance of the operator 106 and/or vehicle 105, the current environment of the vehicle 105, etc.). As such, the awareness computing system 185 can determine the safety time threshold 350 as a criterion of the awareness challenge 227.

In the event that the operator 106 does not provide user input that satisfies the awareness challenge 227 before the safety time threshold 350 is reached (e.g., at time 330), the vehicle 105 can undertake precautionary safety measures. For example, the awareness computing system 185 can be configured to monitor the elapsed time (e.g., from the initiation of the timer at time 310, from the expiration of the challenge response interval 230 (e.g., at time 320), etc.). The awareness computing system 185 can detect that the elapsed time corresponds to (e.g., has reached) the safety time threshold 330 (e.g., identifying an amount of elapsed time after the expiration of the challenge response interval 230). In response to detecting that the elapsed time corresponds to (e.g., has reached) the safety time threshold 330, the awareness computing system 185 can initiate a safety stop routine. By way of example, the safety time threshold 350 for an awareness challenge can be ten seconds after the expiration of the challenge response interval 230 (e.g., at time 320). In the event that the operator 106 of a vehicle 105 continues to ignore the awareness challenge 227 for ten seconds after the expiration of the challenge response interval 230 (e.g., at time 320), the awareness computing system 185 can initiate the safety stop routine. In such a case, the awareness computing system 185 can communicate a harsh notification for ten seconds after the expiration of the challenge response interval 230 (e.g., at time 320). If the operator 106 fails to satisfy the awareness challenge 227 during that ten second period (e.g., by providing the correct user input), the awareness computing system 185 can respond by providing a signal to initiate the vehicle 105 to implement a motion control to come to a safe stop. This can include autonomously decelerating the vehicle 105 to a stopped position at a safe location (e.g., on the right shoulder of a travel way, a parking space, etc.).

Turning to FIG. 4, FIG. 4 depicts an example portion of a vehicle interior 400 of a vehicle (e.g., vehicle 105) showing challenge response hardware device(s) 220 according to example embodiments of the present disclosure. FIG. 4 shows the vehicle interior 400 associated with an automobile for example discussion purposes only and is not meant to be limiting. As described, the vehicle can be other types of vehicles.

The challenge response hardware 220 can include one or more input device(s) and one or more output device(s) to communicate, for example, with a vehicle operator 106. In some implementations, the challenge response hardware 220 can include one or more input device(s) configured to receive user input such as, for example, one or more buttons, one or more microphones, and/or any other input device configured to receive user input. Moreover, in some implementations, the challenge response hardware 220 can include one or more output device(s) such as, for example, one or more lights, one or more speakers, and/or any other output device.

FIG. 5 depicts an example embodiment of the challenge response hardware 220 according to example embodiments of the present disclosure. FIG. 5 shows the challenge response hardware 220 including a series of lights (e.g., 520, 510, and 530), a button 540, and a speaker 550 for example discussion purposes only and is not meant to be limiting. As described herein, the challenge response hardware 220 can include any number of input/output devices and/or different types and configurations of such devices.

In some implementations, the output devices can be configured to provide at least one of one or more soft notifications, one or more harsh notifications or one or more informational notifications (e.g., prompts 245). The challenge response hardware 220 can provide the one or more soft notifications and/or one or more harsh notifications from the same output device or independently from different output devices. For example, in some implementations, the challenge response hardware 220 can provide a soft notification via a series of lights 520, while the harsh notification is provided via a speaker 550. The awareness computing system 185 can provide at least one of the one or more soft notifications, one or more harsh notifications, or one or more informational notifications (e.g., prompts 245) to the operator 106 via at least one of an output device of a vehicle 105 (e.g., the HMI 190), an output device of a user device associated with the operator 106 and/or the challenge response hardware 220.

The soft notifications can include at least one stimulus such as visual, tactile, or auditory, etc. For example, the soft notification can include a visual stimulus that illuminates, dulls, changes color, gradient, etc. as time elapses. For example, as described above, the soft notification can include a series of at lights 520 indicating the elapsed time within the challenge response interval 230. In such a case, the awareness computing system 185 can control the series of lights 520 to change one or more of the lights in a predefined order as the elapsed time approaches the expiration of the challenge response interval 230 (e.g., at 320). For instance, one or more of the series of lights can illuminate or dull in proportion to the elapsed time. Additionally, or alternatively, the soft notification can include haptic feedback (e.g., via the driver seat of a vehicle 105), multicolored lights (e.g., from the HMI 190 onboard the vehicle 105), etc.

The harsh notification can be the same or differ from the soft notification and can act as additional encouragement for the operator 106 of the vehicle 105 to satisfy the awareness challenge 227. In this regard, the harsh notification can differ in severity and form from the soft notification. For example, the soft notification can include the illumination or dulling of a series of lights 520, while the harsh notification can include an auditory stimulus such as, for example, a sound resembling that of an alarm clock. For example, the awareness computing system 185 can trigger the challenge response hardware 220 to emit one or more sounds via the speaker 550. Moreover, in some implementations, like the soft notification, the harsh notification (e.g., the sound) can correspond to the elapsed time. For instance, the severity of the hard notification can correspond to elapsed time. By way of example, the harsh notification can include an auditory stimulus that escalates (e.g., in volume, frequency, etc.) in proportion to the elapsed time. Moreover, upon detecting user input that satisfies the awareness challenge (e.g., after expiration of the challenge response interval), the awareness computing system can reset the awareness challenge 227. This can include, for example, resetting the harsh notification indicative of the expiration of the challenge response interval (e.g., by halting the auditory stimulus).

In some implementations, the challenge response hardware 220 can include additional output device(s) to provide informational notifications. For example, the challenge response hardware 220 can include one or more lights 510 to indicate the response time 235 to the vehicle operator 106.

For example, the one or more lights 510 can illuminate when the elapsed time reaches the response time 235. In this manner, the challenge response hardware 220 can inform the operator 106 when the awareness challenge 227 can be reset.

Other informational notifications can include error light(s) 530 indicative of one or more errors, an indication of the operator score, and/or an indication of the operator rank. For example, the challenge response hardware 220 can illuminate the error light(s) 530 upon detecting a fault (e.g., a software and/or hardware fault) within the challenge response hardware 220. Additionally, or alternatively, in some implementations, the challenge response hardware 220 can illuminate the error light(s) 530 when the elapsed time reaches the expiration of the challenge response interval 230 (e.g., at time 320). In some implementations, the error light(s) 530 can illuminate before the challenge response hardware 220 provides the harsh notification. For example, the error light(s) 530 can act as a final warning before the harsh notification begins. In other implementations, the error light(s) 530 can illuminate as part of, or in place of, the harsh notification. For example, the challenge response hardware 220 can illuminate one or more error lights 530 while the providing the harsh notification.

In some implementations, the awareness computing system 185 can provide informational notifications indicative of an operator score to the operator 106 via at least one of an output device of a vehicle 105 (e.g., HMI 190), an output device of a user device associated with the operator 106, and/or the challenge response hardware 220. For example, the challenge response hardware 220 can provide the operator score to the operator in real-time as the operator satisfies one or more awareness challenges. Furthermore, where the awareness computing system 185 determines a rank of the operator, the awareness computing system 185 can provide (e.g., via a user interface of a display device of the challenge response hardware 220, HMI 190, user device, etc.) data indicative of the rank of the operator in comparison to one or more other operators. For example, the challenge response hardware 220 can provide the rank and/or operator score to the operator 106 visually (e.g., via one or more display device(s)), audibly (e.g., via one or more speakers), tactilely (e.g., via haptic feedback), etc.

In some implementations, the challenge response hardware 220 can be further configured to provide one or more prompts 245 via one or more output devices. As discussed herein, the prompt 245 of the awareness challenge can be a request for the action 240 for satisfying the challenge. In some implementations, the challenge response hardware 220 can be configured to provide the prompt 245 (e.g., visually, audibly, tactilely etc.) to the operator 106 of a vehicle 105 via one or more output devices. For example, the challenge response hardware 220 can visually provide the prompt 245 via one or more display devices. Alternatively, or additionally, in some implementations, the challenge response hardware 220 can audibly provide the prompt 245 via one or more speakers such as speaker 550. For example, in one embodiment, the challenge response hardware 220 can be configured to audibly provide the prompt 245, via speaker 550, requesting that the operator 106 of the vehicle 105 press button 540.

Further, in some implementations, the challenge response hardware 220 can be further configured to obtain data indicative user input (e.g., visually, audibly, tactilely etc.) indicative of an action 240 via the one or more input devices. As described above, the action 240 for satisfying the awareness challenge 227 can include any task to be performed by the operator of the vehicle. For example, the challenge response hardware 220 can be configured to detect audile input (e.g., one or more spoken words such as an answer to a question) via one or more microphones. Alternatively, or additionally, the challenge response hardware 220 can be configured to detect visual input (e.g., the wave of a hand, other gesture, etc.) via one or more cameras/sensors. In some implementations, such as the one discussed above, the challenge response hardware 220 can be configured to detect tactile input (e.g., the press of a button, etc.) via one or more button such as button 540.

In some implementations, the awareness computing device 185 can determine different actions 240 for each awareness challenge 227. For example, the action associated with a first awareness challenge can include the operator 106 providing tactile input, while the action associated with a second awareness challenge can include the operator 106 providing audile input. In this manner, the awareness computing device 185 can provide an element of variability reducing the otherwise repetitious nature inherent in current alarm systems.

Figure 7:
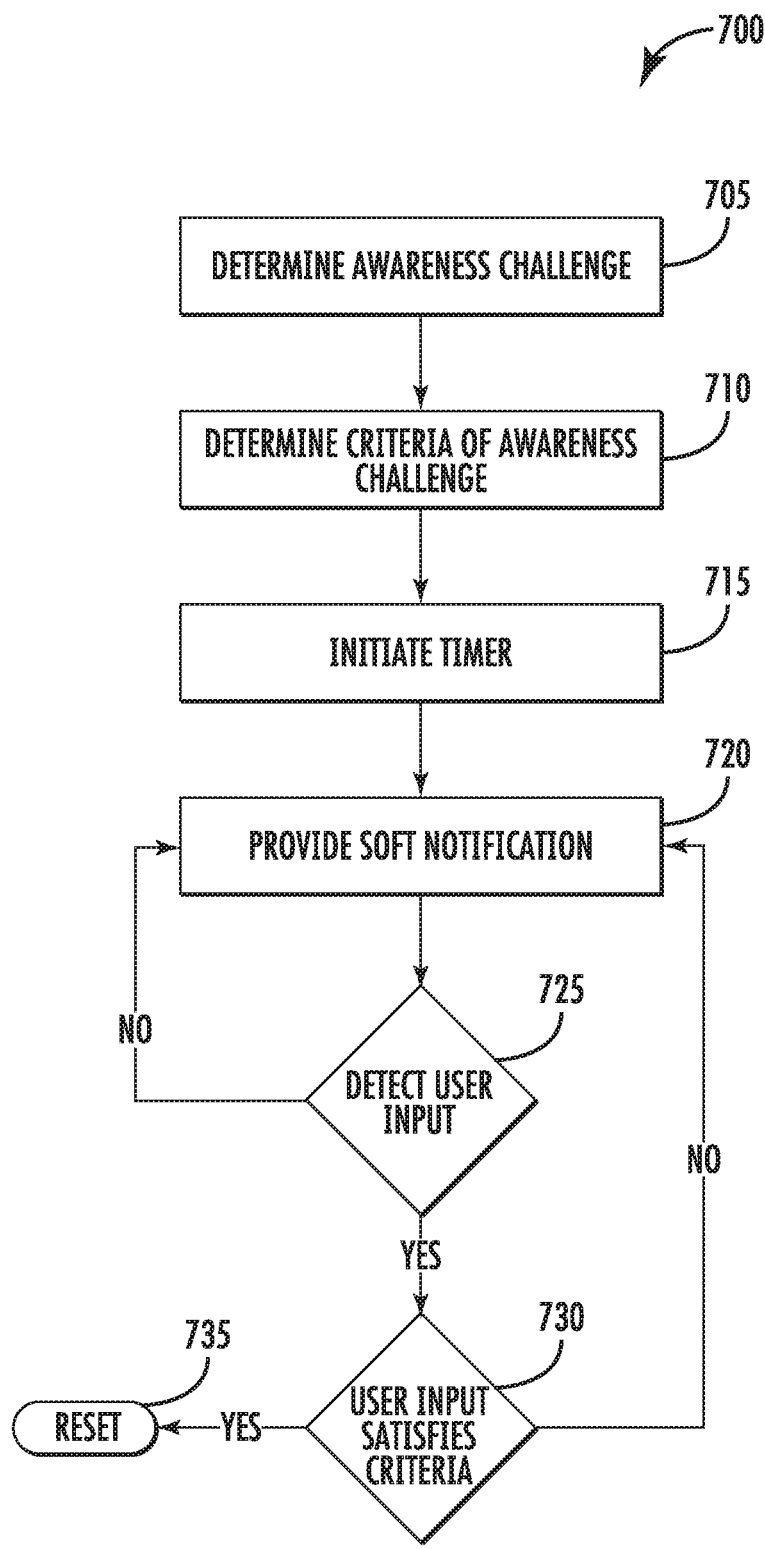
FIG. 7 depicts a flowchart diagram of an example method of maintaining vehicle operator awareness according to example implementations of the present disclosure.

FIG. 7 depicts a flow diagram of an example method 700 for maintaining vehicle operator awareness according to example implementations of the present disclosure. One or more portion(s) of the method 700 can be can be implemented by a computing system that includes one or more computing devices such as, for example, the computing systems described with reference to the other figures (e.g., the vehicle computing system 100, the awareness computing system 185, the operations computing system 195, etc.). Each respective portion of the method 700 can be performed by any (or any combination) of one or more computing devices. Moreover, one or more portion(s) of the method 700 can be implemented as an algorithm on the hardware components of the device(s) described herein (e.g., as in FIGS. 1-2, 4-5, and/or 10), for example, to allow vehicles to maintain the awareness of vehicle operators. FIG. 7 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, and/or modified in various ways without deviating from the scope of the present disclosure. FIG. 7 is described with reference to elements/terms described with respect to other systems and figures for example illustrated purposes and is not meant to be limiting. One or more portions of method 700 can be performed additionally, or alternatively, by other systems.

At (705), the method 700 can include determining an awareness challenge. A computing system can determine an awareness challenge 227 having one or more criteria for an operator 106 of a vehicle 105. The one or more criteria can include a challenge response interval 230 indicative of a first period of time for the operator 106 of the vehicle 105 to complete the awareness challenge, a response time 235 within the first period of time, and an action 240 for satisfying the awareness challenge. In some implementations, the awareness computing system 185 can determine one or more awareness challenges. In some implementations, one or more remote computing systems (e.g., operations computing system 195) can trigger the awareness computing system 185 to determine the one or more awareness challenges. Additionally, or alternatively, the awareness computing system 185 can determine one or more awareness challenges based on one or more factors. For example, the awareness computing system 185 can be configured to determine one or more awareness challenges based on the time of day, the time elapsed since the expiration of a previous awareness challenge, route conditions, etc.

At (710), the method 700 can include determining the criteria of the awareness challenge 227. As described herein, the one or more criteria can include a challenge response interval 230 indicative of a first period of time for the operator 106 of the vehicle 105 to complete the awareness challenge 227, a response time 235 within the first period of time, and an action 240 for satisfying the awareness challenge. In some implementations, at least one of the criteria of the awareness challenge can be associated with the vehicle operator 106 (e.g., tailored to the specific operator). Additionally, or alternatively, in some implementations, at least one of the criteria of the awareness challenge 227 can be associated with an operator score associated with the vehicle operator 106. As described herein, the operator score can be based at least in part on past challenge performance. Additionally, or alternatively, at least one of the criteria of the awareness challenge can be randomized as described herein. Additionally, or alternatively, at least one of the criteria of the awareness challenge can be based on supervisor input (e.g., associated with a supervisor of an operator 106).

In some implementations, the vehicle 105 can be an autonomous vehicle, and at least one of the criteria of the awareness challenge 227 can be associated with at least one of a navigation route associated with the autonomous vehicle 105 or a motion plan 180 associated with the autonomous vehicle 105, as described herein. Additionally, or alternatively, at least one of the criteria of the awareness challenge is associated with a performance associated with the vehicle 105 (e.g., developing software performance).

At (715), the method 700 can include initiating a timer measuring elapsed time from a start time of the challenge response interval 230. For instance, a computing system (e.g., the awareness computing system 185, operations computing system 195, etc.) can initiate a timer measuring elapsed time from a start time 310 of the challenge response interval 230.

At (720), the method 700 can include communicating a soft notification indicative of the awareness challenge. For instance, a computing system (e.g., (the awareness computing system 185, operations computing system 195, etc.) can communicate to the operator 106 of the vehicle 105 a soft notification indicative of the awareness challenge 227 during the challenge response interval 230. For example, in some implementations, the soft notification can include a series of lights 520 indicating the elapsed time within the challenge response interval 230 and one or more of the series of lights 520 can illuminate or dull in proportion to the elapsed time.

The method 700 can include determining (e.g., by the awareness computing system 185, operations computing system 195, etc.) whether the operator 106 of the vehicle 105 provides a user input after the response time interval 340 and whether the user input corresponds to the action for satisfying the awareness challenge 227. For instance, at (725), the method 700 can include detecting whether the operator 106 of the vehicle 105 provides a user input after the response time 235 and whether the user input corresponds to the action 240 for satisfying the awareness challenge 227. At (730), the method 700 can include determining that the user input satisfies the criteria. For example, a computing system (e.g., the awareness computing system 185, operations computing system 195, etc.) can determine that the user input satisfies the criteria when the operator 106 of the vehicle 105 provides a user input corresponding to the action 240 for satisfying the awareness challenge 227 after the response time 235.

In some implementations, at (735) the method 700 can include resetting the awareness challenge. For instance, in response to detecting the user input at (730), prior to an expiration of the challenge response interval 230, a computing system (e.g., the awareness computing system 185, operations computing system 195, etc.) can reset the awareness challenge. In some implementations, resetting the awareness challenge includes resetting the soft notification (e.g., by returning the lights to a default setting, dulling all the lights, illuminating all the lights, etc.). Moreover, in some implementations, resetting the awareness challenge 227 can include determining one or more new criteria for the awareness challenge 227. For example, a computing system (e.g., the awareness computing system 185, operations computing system 195, etc.) can be configured to determine a new awareness challenge immediately after, and/or a predetermined amount of time after, the operator 106 satisfies a previously determined awareness challenge. For instance, in some implementations, the awareness computing system 185 can be configured to determine a new awareness challenge immediately after the operator 106 of the vehicle 105 satisfies the criteria of the previously determined awareness challenge. In this manner, the awareness computing system 185 can continuously engage the operator 106 of the vehicle 105 with unique challenges including distinct actions 240, response times 235, and/or challenge response intervals 230.

In some implementations, the one or more new criteria for the awareness challenge 227 are determined based at least in part on the user input. In this way, the awareness computing system 185 can discourage workarounds by adapting each awareness challenge to the user input provided in at least one previous challenge. For example, as described herein, the awareness computing system 185 can determine more or less difficult awareness challenges based on the user input.

Figure 8:
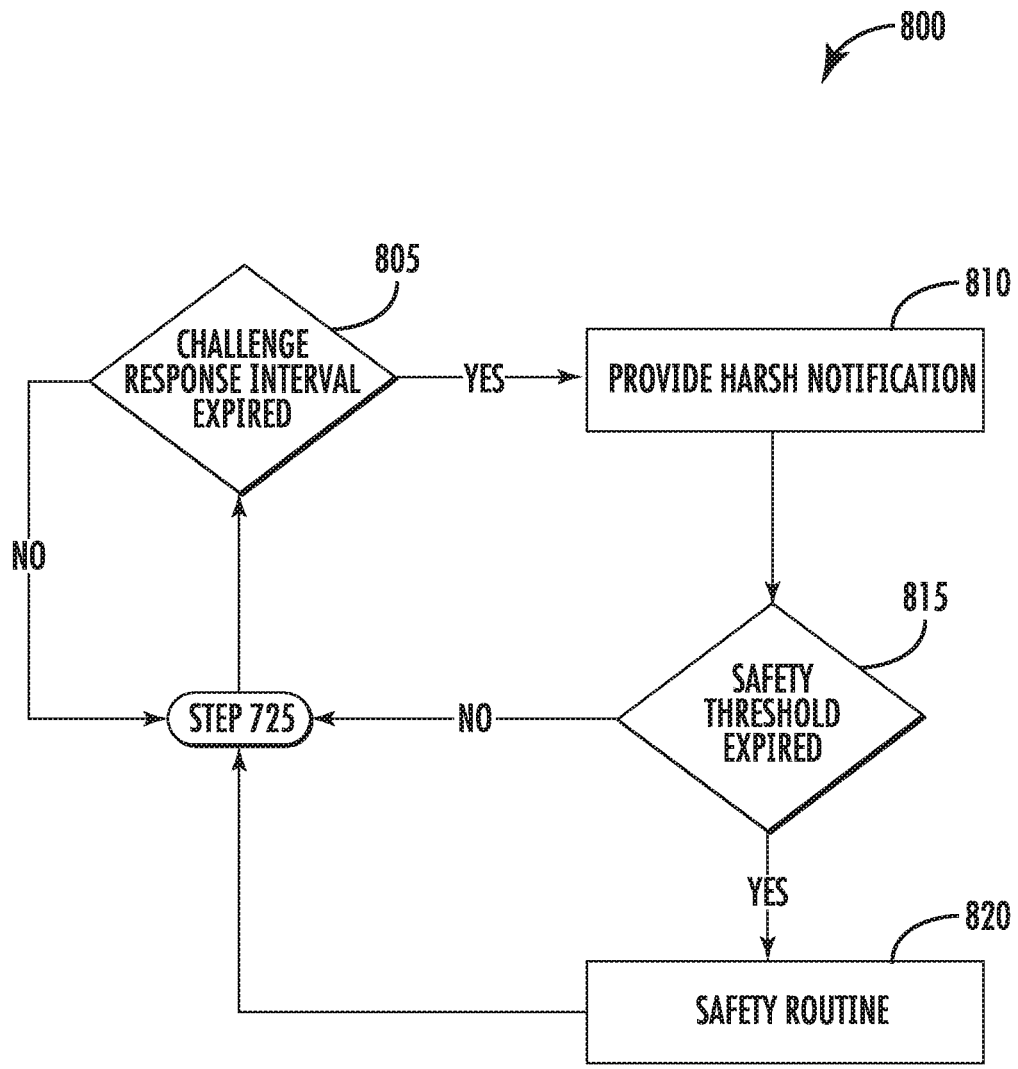
FIG. 8 depicts a flowchart diagram of an example method of determining one or more actions after a challenge response interval of an awareness challenge expires according to example implementations of the present disclosure.

FIG. 8 depicts a flow diagram of an example method 800 for maintaining vehicle operator awareness according to example embodiments of the present disclosure. One or more portion(s) of the method 800 can be can be implemented by a computing system that includes one or more computing devices such as, for example, the computing systems described with reference to the other figures (e.g., the vehicle computing system 100, the awareness computing system 185, the operations computing system 195, etc.). Each respective portion of the method 800 can be performed by any (or any combination) of one or more computing devices. Moreover, one or more portion(s) of the method 800 can be implemented as an algorithm on the hardware components of the device(s) described herein (e.g., as in FIGS. 1-2, 4-5, and/or 10), for example, to allow vehicles to maintain the awareness of vehicle operators. FIG. 8 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, and/or modified in various ways without deviating from the scope of the present disclosure. FIG. 8 is described with reference to elements/terms described with respect to other systems and figures for example illustrated purposes and is not meant to be limiting. One or more portions of method 800 can be performed additionally, or alternatively, by other systems.

Method 800 begins at (725) of method 700 whereby a computing system (e.g., the awareness computing system 185, operations computing system 195, etc.) detects whether use input has been provided by a vehicle operator 106 for the awareness challenge 227. At (805), the method 800 can include detecting the expiration of the challenge response interval 230 (e.g., at time 320 shown in FIG. 3). For instance, a computing system (e.g., the awareness computing system 185, operations computing system 195, etc.) can determine that no user input satisfying the awareness challenge 227 has been provided during at appropriate time within the challenge response interval 230 (e.g., after the response time). Accordingly, the computing system can determine that the challenge response interval has expired.

At (810), the method 800 can include communicating, to the operator of the vehicle, a harsh notification. For instance, a computing system (e.g., the awareness computing system 185, operations computing system 195, etc.) can communicate, to the operator 106 of the vehicle 105, a harsh notification indicative of the expiration of the challenge response interval 230 in response to determining that the operator 106 of the vehicle 105 has not provided the user input before the expiration of the challenge response interval 230 and/or that the user input does not correspond to the action 240 for satisfying the awareness challenge 227. In some implementations, the severity of the harsh notification can correspond to elapsed time (e.g., the volume of an auditory stimulus can grow louder as time further elapses).

In the event that user input is detected after expiration of the challenge response interval 230 (but before the safety time threshold is reached), a computing system (e.g., the awareness computing system 185, operations computing system 195, etc.) can reset the awareness challenge 227 (e.g., as described with reference to (735) of FIG. 7), which can include resetting the harsh notification indicative of the expiration of the challenge response interval 230. For example, the awareness computing system 185 can halt the harsh notification after detecting user input indicative of the action 240 for satisfying the awareness challenge after the response time 235.

At (815), the method 800 can include detecting a correspondence to a safety time threshold. For instance, a computing system (e.g., the awareness computing system 185, operations computing system 195, etc.) can detect the elapsed time has reached a safety time threshold 350. The safety time threshold 350 can identify an amount of elapsed time after the expiration of the challenge response interval 230 (e.g., 1 s, 2 s, 5 s, 10 s, etc. after the expiration of the challenge response interval 230).

At (820), the method 800 can include initiating a safety stop routine for the vehicle. For instance, in response to detecting the elapsed time corresponds to the safety time threshold 350, a computing system (e.g., the awareness computing system 185, operations computing system 195, etc.) can initiate a safety stop routine. For example, where the vehicle is an autonomous vehicle 105, the computing system can send one or more signals to the vehicle's onboard system(s) (e.g., autonomy system, controller, control systems, etc.) to trigger the vehicle 105 to detect a safe location (e.g., an unoccupied shoulder of a road) and bring the vehicle 105 to a stopped position in the safe location.

Figure 9:
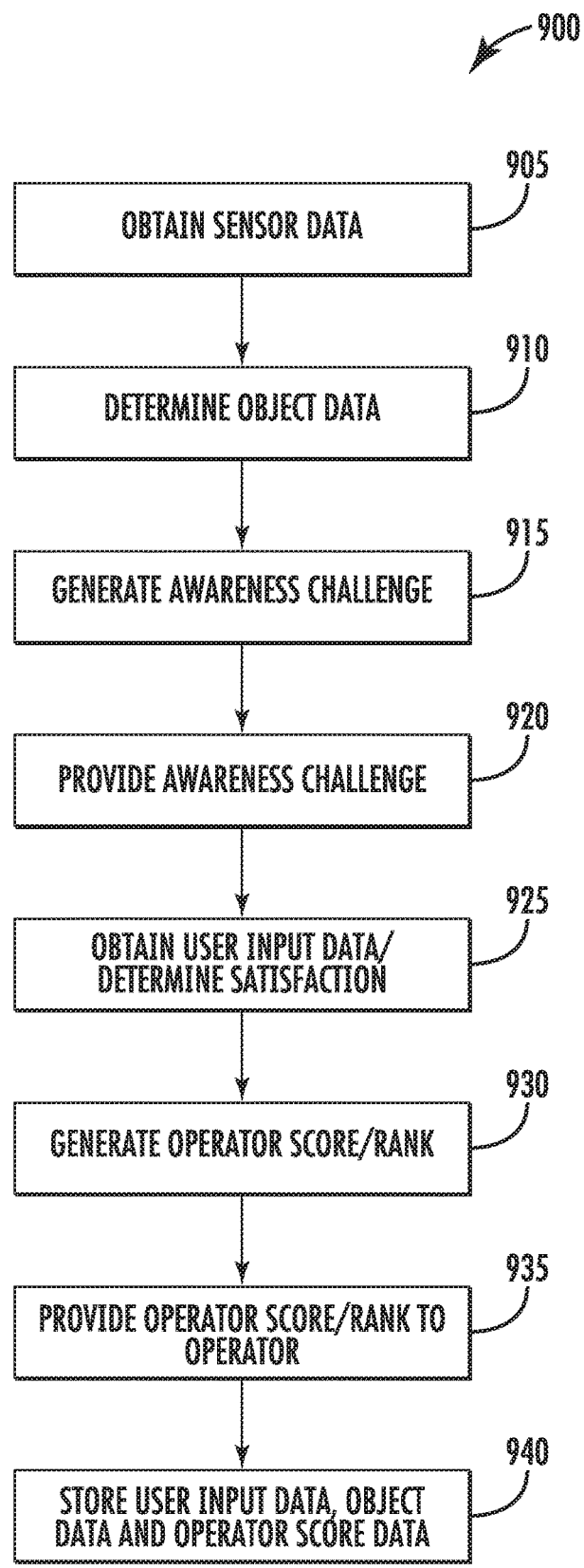
FIG. 9 depicts a flowchart diagram of an example method of generating an awareness challenge according to example implementations of the present disclosure.

FIG. 9 depicts a flow diagram of an example method 900 for maintaining vehicle operator awareness according to example embodiments of the present disclosure. One or more portion(s) of the method 900 can be can be implemented by a computing system that includes one or more computing devices such as, for example, the computing systems described with reference to the other figures (e.g., the vehicle computing system 100, the awareness computing system 185, the operations computing system 195, etc.).

Each respective portion of the method 900 can be performed by any (or any combination) of one or more computing devices. Moreover, one or more portion(s) of the method 900 can be implemented as an algorithm on the hardware components of the device(s) described herein (e.g., as in FIGS. 1-2, 4-5, and/or 10), for example, to allow vehicles to maintain the awareness of vehicle operators. FIG. 9 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, and/or modified in various ways without deviating from the scope of the present disclosure. FIG. 9 is described with reference to elements/terms described with respect to other systems and figures for example illustrated purposes and is not meant to be limiting. One or more portions of method 900 can be performed additionally, or alternatively, by other systems.

At (905), the method 900 can include obtaining sensor data. For instance, a computing system (e.g., the awareness computing system 185, operations computing system 195, etc.) can obtain sensor data 140 associated with a surrounding environment 600 of a vehicle 105 via the one or more vehicle sensors 125. The sensor data 140 can include image data, LIDAR data, and/or other types of data.

At (910), the method 900 can include determining object data associated with one or more objects within the vehicle's surrounding environment. For instance, a computing system (e.g., the awareness computing system 185, operations computing system 195, etc.) can determine object data associated with one or more objects based at least in part on the sensor data 140. The object data can be indicative of one or more characteristics associated with each of the one or more objects. For example, the object data can be indicative of the type, location, color, etc. of a vehicle 610 that is proximate the vehicle 105.

At (915), the method 900 can include generating an awareness challenge based at least in part on the object data. For instance, a computing system (e.g., the awareness computing system 185, operations computing system 195, etc.) can generate an awareness challenge 227 based at least in part on the object data. The awareness challenge 227 can include a prompt 245 that is based at least in part on the object data. For instance, in some implementations, the prompt 245 of the awareness challenge can include one or more questions based on the object data. By way of example, the prompt 245 of the awareness challenge can include one or more questions associated with at least one of a type and/or a location of the object (e.g., nearby vehicle 610) within the surrounding environment 600 of the vehicle 105.

At (920), the method 900 can include presenting the operator with the awareness challenge. For instance, a computing system (e.g., the awareness computing system 185, operations computing system 195, etc.) can provide the prompt 245 of the awareness challenge 227 to an operator 106 of the autonomous vehicle 105. In some implementations, providing the prompt 245 of the awareness challenge to the operator 106 of the vehicle 105 can include outputting an audible communication indicative of the prompt 245 of the awareness challenge via one or more output devices (e.g., speaker 550). In some implementations, the operator 106 of the vehicle 105 can located within the vehicle 105. In other implementations, the operator 106 of the vehicle 105 can be located remotely from the vehicle 105.

In some implementations, the computing system (e.g., the awareness computing system 185, operations computing system 195, etc.) can initiate a timer measuring elapsed time from a start time of a challenge response interval 230 indicative of a first period of time for the operator 106 to complete the awareness challenge 227. The computing system can communicate, to the operator 106 of the vehicle 105, a soft notification indicative of the awareness challenge 227 during the challenge response interval 230. This can include, for example, the illumination and/or dulling of one or more light(s).

At (925), the method 900 can include obtaining data indicative of a user input in response the awareness challenge. For instance, a computing system (e.g., the awareness computing system 185, operations computing system 195, etc.) can obtain data indicative of a user input in response to the prompt 245 of the awareness challenge 227. For example, in the event of that the prompt 245 includes a question (e.g., "what color is the vehicle to the right"), the user input may be indicative of an answer to that questions. The computing system can include determine whether the user input satisfies the awareness challenge 227 based at least in part on a comparison of the user input and the object data. For example, where the prompt 245 is a question regarding an object within the surrounding environment of the vehicle 105 (e.g., "what color is the vehicle to the right"), the computing system can determine that the awareness challenge is satisfied when the operator provides user input indicative of the answer to the question (e.g., the vehicle color as determined by the object data).

At (930), the method 900 can include generating an operator score and/or rank associated with the operator. For instance, a computing system (e.g., the awareness computing system 185, operations computing system 195, etc.) can generate an operator score based on the comparison of the user input and the object data. By way of example, where the prompt 245 is a question and the user input is the answer to the question (e.g., formulated based on the object data), the computing system can generate an operator score based at least in part on the correctness of the answer given (e.g., as determined by the object data). In some implementations, the computing system can determine a rank of the operator 106 in comparison to one or more other operators based at least in part on the operator score. For example, the computing system can rank a first operator higher relative to a second operator where the first operator provides more correct responses to awareness challenges than the second operator.

At (935), the method 900 can include providing the operator score and/or rank to the operator. For instance, in some implementations, a computing system (e.g., the awareness computing system 185, operations computing system 195, etc.) can provide the operator score to the operator 106 via one or more output devices of the challenge response hardware 220 (e.g., via a speaker, user interface of a display device, etc.). Additionally, or alternatively, the computing system can provide for display (e.g., via a user interface of a display device), data indicative of the rank of the operator 106 in comparison to the one or more other operators. The computing system can be configured to update the operator score and/or rank in real-time and/or near real-time (accounting for any processing and communication delays).

At (940), the method 900 can include storing data indicative of the user input, the object data, and data indicative of the operator score. For instance, a computing system (e.g., the awareness computing system 185, operations computing system 195, etc.) can store at least one of data indicative of the user input, the object data, and/or data indicative of the operator score in a memory as part of an operator history associated with the operator 106. This can include, providing, (e.g., via communication systems 120), data indicative of the user input, object data, and the operator score to one or more servers for storage as part of an operator history associated with the vehicle operator 106.

Figure 10:
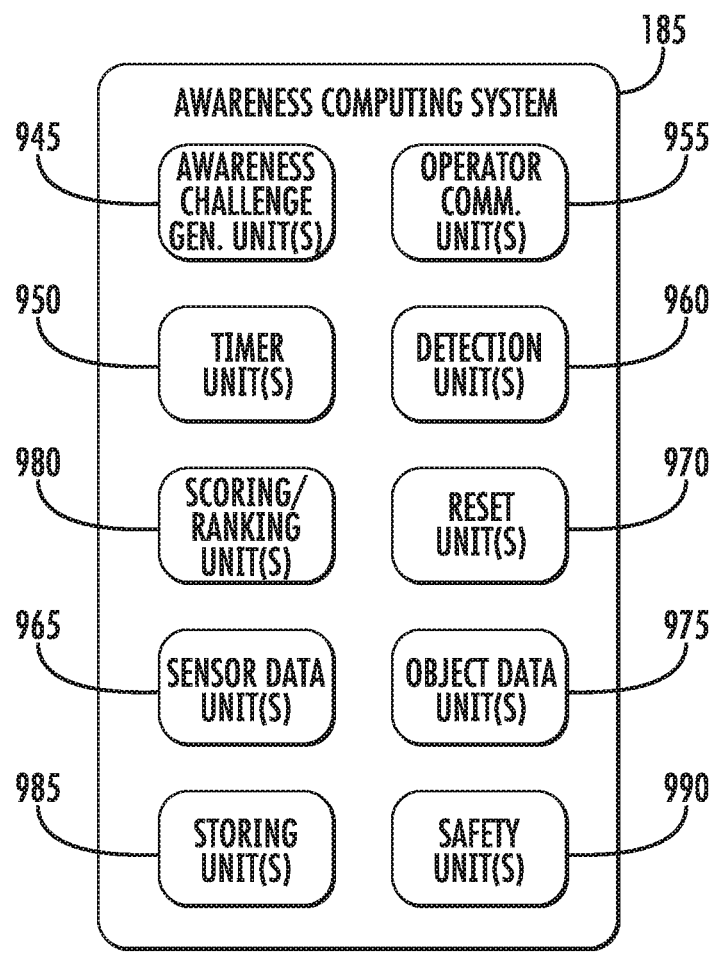
FIG. 10 depicts example system with various means for performing operations and functions according to example implementations of the present disclosure.

Various means can be configured to perform the methods and processes described herein. For example, FIG. 10 depicts a diagram of an example a computing system 10 that includes various means according to example embodiments of the present disclosure. The computing system 10 can be and/or otherwise include, for example, the awareness computing system 185. The computing system 10 can include awareness challenge generation unit(s) 945, timer unit(s) 950, operator communication unit(s) 955, detection unit(s) 960, sensor data unit(s) 965, reset unit(s) 970, object data unit(s) 975, scoring/ranking unit(s) 980, storing unit(s) 985, safety unit(s) 990, and/or other means for performing the operations and functions described herein. In some implementations, one or more of the units may be implemented separately. In some implementations, one or more units may be a part of or included in one or more other units.

These means can include processor(s), microprocessor(s), graphics processing unit(s), logic circuit(s), dedicated circuit(s), application-specific integrated circuit(s), programmable array logic, field-programmable gate array(s), controller(s), microcontroller(s), and/or other suitable hardware. The means can also, or alternately, include software control means implemented with a processor or logic circuitry for example. The means can include or otherwise be able to access memory such as, for example, one or more non-transitory computer-readable storage media, such as random-access memory, read-only memory, electrically erasable programmable read-only memory, erasable programmable read-only memory, flash/other memory device(s), data registrar(s), database(s), and/or other suitable hardware.

The means can be programmed to perform one or more algorithm(s) for carrying out the operations and functions described herein. The methods (e.g., 700, 800, 900) and/or other operations described herein can be implemented as such algorithm(s). For instance, the means (e.g., the awareness challenge generator unit(s) 945) can be configured for determining an awareness challenge 227 for an operator 106 of a vehicle 105. For instance, the means (e.g., the sensor data unit(s) 965) can be configured for obtaining sensor data 140 associated with a surrounding environment 600 of a vehicle 105 (e.g., an autonomous vehicle). The means (e.g., the object data unit(s) 975) can be configured for determining object data associated with one or more objects within the surrounding environment 600 based at least in part on the sensor data 140. As described herein, the object data can be indicative of one or more characteristics associated with one or more objects. The means (e.g., the awareness challenge generation unit(s) 945) can be configured for generating an awareness challenge 227 based at least in part on the object data. As described herein, the awareness challenge 227 can include a prompt 245 that is based at least in part on the object data (e.g., a question about a characteristic of an object).

The means can be configured for issuing the awareness challenge as described herein. For instance, the means (e.g., the operator communication unit(s) 955 can be configured for providing the prompt 245 of the awareness challenge 227 to an operator 106 of the vehicle 105. For example, the means (e.g., the operator communication unit(s) 955) can be configured for outputting an audible communication indicative of the prompt 245 of the awareness challenge 227 via one or more output devices (e.g., display devices, speakers, etc.). The means (e.g., the timer unit(s) 950) can be can be configured for initiating a timer measuring elapsed time from a start time of the challenge response interval 230. The means (e.g., the operator communication unit(s) 955) can be configured for communicating to the operator 105 of the vehicle 106 a soft notification indicative of the awareness challenge 227 during the challenge response interval 230. The means (e.g., the detection unit(s) 960) can be configured for determining whether the operator 106 of the vehicle 105 provides a user input after the response time interval 340 and/or whether the user input corresponds to the action 240 for satisfying the awareness challenge 227. The means (e.g., the operator communication unit(s) 955) can be configured for communicating a harsh notification indicative of the expiration of the challenge response interval 230 in response to determining that the operator 106 of the vehicle 105 has not provided the user input before the expiration of the challenge response interval 230 and/or that the user input does not correspond to the action 240 for satisfying the awareness challenge 227. The means (e.g., the safety unit(s) 990) can be configured for initiate a safe stop (e.g., when a safety threshold is reached), as described herein.

The means (e.g., the detection unit(s) 960) can be configured for obtaining data indicative of a user input in response to the prompt 245 of the awareness challenge 227. This can include, for instance, obtaining from the operator 106 data indicative of one or more answers to one or more prompted questions (e.g., based at least in part on object data). The means (e.g., the reset unit 970) can be configured for resetting the soft notification indicative of the awareness challenge 227 in response to detecting the user input, prior to an expiration of the challenge response interval 230. The means (e.g., the awareness challenge generation unit(s) 945) can be configured for determining one or more new criteria for the awareness challenge 227.

The means (e.g., the scoring/ranking unit(s) 980) can be configured for generating an operator score (e.g., based at least in part on a comparison of the user input and the object data). The means (e.g., the scoring/ranking unit(s) 980) can be configured for determining a rank of the operator 106, as described herein. The means (e.g., the operator communication unit(s) 955) can be configured for providing the operator score and/or rank to the operator 106 (e.g., via at least one of an output device of the vehicle 105, an output device of a user device associated with the operator 106, HMI 190, etc.). The means (e.g., the storing unit(s) 985) can be configured for storing data. For instance, the means (e.g., the storing unit(s) 985) can be configured for storing data indicative of the user input, the object data, and data indicative of the operator score in a memory as part of an operator history associated with the operator 106.

These described functions of the means are provided as examples and are not meant to be limiting. The means can be configured for performing any of the operations and functions described herein.

Figure 11:
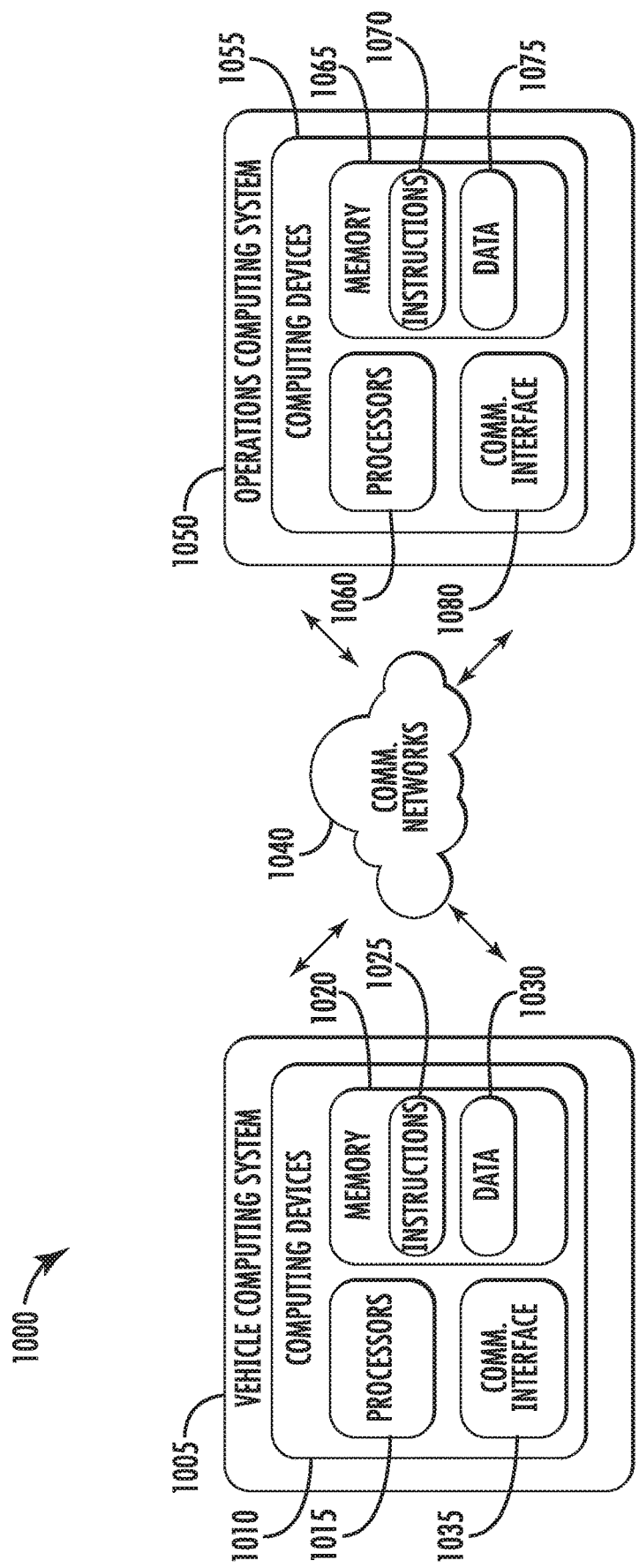
FIG. 11 depicts example system components according to example implementations of the present disclosure.

FIG. 11 depicts an example system 1000 according to example embodiments of the present disclosure. The example system 1000 illustrated in FIG. 10 is provided as an example only. The components, systems, connections, and/or other aspects illustrated in FIG. 10 are optional and are provided as examples of what is possible, but not required, to implement the present disclosure. The example system 1000 can include a vehicle computing system 1005 of a vehicle. The vehicle computing system 1005 can represent/correspond to the vehicle computing systems described herein (e.g., vehicle computing system 100). The example system 1000 can include a remote computing system 1050 (e.g., that is remote from the vehicle computing system 1005). The remote computing system 1050 can represent/correspond to, for example, any of the computing systems that are remote from the vehicle described herein (e.g., the operations computing system 195, etc.). The vehicle computing system 1005 and the remote computing system 1050 can be communicatively coupled to one another over one or more network(s) 1040.

The computing device(s) 1010 of the vehicle computing system 1005 can include processor(s) 1015 and a memory 1020. The one or more processors 1015 can be any suitable processing device (e.g., a processor core, a microprocessor, an ASIC, a FPGA, a controller, a microcontroller, etc.) and can be one processor or a plurality of processors that are operatively connected. The memory 1020 can include one or more non-transitory computer-readable storage media, such as RAM, ROM, EEPROM, EPROM, one or more memory devices, flash memory devices, data registrar, etc., and combinations thereof.

The memory 1020 can store information that can be accessed by the one or more processors 1015. For instance, the memory 1020 (e.g., one or more non-transitory computer-readable storage mediums, memory devices) on-board the vehicle can include computer-readable instructions 1025 that can be executed by the one or more processors 1015. The instructions 1025 can be software written in any suitable programming language or can be implemented in hardware. Additionally, or alternatively, the instructions 1025 can be executed in logically and/or virtually separate threads on processor(s) 1015.

For example, the memory 1020 can store instructions 1025 that when executed by the one or more processors 1015 cause the one or more processors 1015 (the vehicle computing system 1005) to perform operations such as any of the operations and functions of the vehicle computing system 100 (or for which it is configured), one or more of the operations and functions of the awareness computing system (or for which it is configured), one or more of the operations and functions of the operations computing systems 195 described herein (or for which it is configured), one or more of the operations and functions maintaining vehicle operator awareness, one or more portions of the methods 700, 800, 900, and/or one or more of the other operations and functions of the computing systems described herein.

The memory 1020 can store data 1030 that can be obtained (e.g., acquired, received, retrieved, accessed, created, stored, written, manipulated, etc.). The data 1030 can include, for instance, sensor data, map data, vehicle state data, perception data, prediction data, motion planning data, data associated with a vehicle client, data associated with a service entity's telecommunications network, data associated with an API, data associated with awareness challenges, data indicative of criteria, data indicative of user input, data indicative of profile data, data indicative of supervisor input, data indicative of timing constraints/thresholds, and/or other data/information such as, for example, that described herein. In some implementations, the computing device(s) 1010 can obtain data from one or more memories that are remote from the vehicle computing system 1005.

The computing device(s) 1010 can also include a communication interface 1035 used to communicate with one or more other system(s) on-board a vehicle and/or a remote computing device that is remote from the vehicle (e.g., of the remote computing system 1050). The communication interface 1035 can include any circuits, components, software, etc. for communicating via one or more networks (e.g., network(s) 1040). The communication interface 1035 can include, for example, one or more of a communications controller, receiver, transceiver, transmitter, port, conductors, software and/or hardware for communicating data.

The remote computing system 1050 can include one or more computing device(s) 1055 that are remote from the vehicle computing system 1005. The computing device(s) 1055 can include one or more processors 1060 and a memory 1065. The one or more processors 1060 can be any suitable processing device (e.g., a processor core, a microprocessor, an ASIC, a FPGA, a controller, a microcontroller, etc.) and can be one processor or a plurality of processors that are operatively connected. The memory 1065 can include one or more tangible, non-transitory computer-readable storage media, such as RAM, ROM, EEPROM, EPROM, one or more memory devices, flash memory devices, data registrar, etc., and combinations thereof.

The memory 1065 can store information that can be accessed by the one or more processors 1060. For instance, the memory 1065 (e.g., one or more tangible, non-transitory computer-readable storage media, one or more memory devices, etc.) can include computer-readable instructions 1070 that can be executed by the one or more processors 1060. The instructions 1070 can be software written in any suitable programming language or can be implemented in hardware. Additionally, or alternatively, the instructions 1070 can be executed in logically and/or virtually separate threads on processor(s) 1060.

For example, the memory 1065 can store instructions 1070 that when executed by the one or more processors 1060 cause the one or more processors 1060 to perform operations such as any of the operations and functions of the operations computing systems 195 described herein, any of the operations and functions of the awareness computing system 185 as described herein, one or more of the operations and functions maintaining the awareness of vehicle operators, one or more portions of the methods 700, 800, 900, and/or one or more of the other operations and functions described herein.

The memory 1065 can store data 1075 that can be obtained. The data 1075 can include, for instance, data associated with vehicles (sensor data, map data, vehicle state data, perception data, prediction data, motion planning data, data associated with a vehicle client, data associated with a service entity's telecommunications network, data associated with an API, etc.), data associated with awareness challenges, data indicative of criteria, data indicative of user input, data indicative of profile data, data indicative of supervisor input, data indicative of timing constraints/thresholds, and/or other data/information such as, for example, that described herein. In some implementations, the computing device(s) 1055 can obtain data from one or more memories that are remote from the computing system 1050 and/or are onboard a vehicle.

The computing device(s) 1055 can also include a communication interface 1080 used to communicate with one or more system(s) local to and/or remote from the computing system 1050. The communication interface 1080 can include any circuits, components, software, etc. for communicating via one or more networks (e.g., network(s) 1040). The communication interface 1080 can include, for example, one or more of a communications controller, receiver, transceiver, transmitter, port, conductors, software and/or hardware for communicating data.

The network(s) 1040 can be any type of network or combination of networks that allows for communication between devices. In some implementations, the network(s) 1040 can include one or more of a local area network, wide area network, the Internet, secure network, cellular network, mesh network, peer-to-peer communication link and/or some combination thereof and can include any number of wired or wireless links. Communication over the network(s) 1040 can be accomplished, for instance, via a communication interface using any type of protocol, protection scheme, encoding, format, packaging, etc.

Computing tasks, operations, and functions discussed herein as being performed at a vehicle (e.g., via the vehicle computing system) can instead be performed by computing device(s) that are remote from the vehicle (e.g., via a vehicle provider computing system, an operations computing system 195, etc.), and/or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implemented tasks and/or operations can be performed sequentially or in parallel. Data and instructions can be stored in a single memory device or across multiple memory devices.

The communications between computing systems described herein can occur directly between the systems or indirectly between the systems. For example, in some implementations, the computing systems can communicate via one or more intermediary computing systems. The intermediary computing systems can alter the communicated data in some manner before communicating it to another computing system. Moreover, data obtained by a computing system can be manipulated in some manner before it is communicated to another system.

The number and configuration of elements shown in the figures is not meant to be limiting. More or less of those elements and/or different configurations can be utilized in various embodiments.

While the present subject matter has been described in detail with respect to specific example embodiments and methods thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computer-implemented method of generating a vehicle operator challenge, comprising:
   obtaining, by a computing system comprising one or more computing devices, sensor data associated with a surrounding environment of an autonomous vehicle;
   determining, by the computing system, object data associated with one or more objects within the surrounding environment based at least in part on the sensor data, wherein the object data is indicative of one or more characteristics associated with each of the one or more objects;
   generating, by the computing system, an awareness challenge based at least in part on the object data, wherein the awareness challenge comprises a prompt based at least in part on the object data;
   providing, by the computing system, the prompt of the awareness challenge to an operator of the autonomous vehicle;

obtaining, by the computing system, data indicative of a user input in response to the prompt of the awareness challenge; and generating, by the computing system, an operator score based at least in part on a comparison of the user input and the object data.

2. The computer-implemented method of claim 1, wherein providing the prompt of the awareness challenge to the operator of the autonomous vehicle comprises:

outputting, by the computing system, an audible communication indicative of the prompt of the awareness challenge via one or more output devices.

3. The computer-implemented method of claim 1, further comprising:

providing, by the computing system, the operator score to the operator via at least one of an output device of the autonomous vehicle or an output device of a user device associated with the operator.

4. The computer-implemented method of claim 1, further comprising:

storing, by the computing system, data indicative of the user input, the object data, and data indicative of the operator score in a memory as part of an operator history associated with the operator.

5. The computer-implemented method of claim 1, wherein the prompt of the awareness challenge comprises one or more questions based at least in part on the object data, and wherein the method further comprises:

obtaining from the operator, by the computing system, data indicative of one or more answers to the one or more questions.

6. A computing system for generating a vehicle operator challenge, comprising:

one or more processors; and one or more tangible, non-transitory, computer readable media that collectively store instructions that when executed by the one or more processors cause the computing system to perform operations, the operations comprising:

obtaining sensor data associated with a surrounding environment of an autonomous vehicle;

determining object data associated with an object within the surrounding environment based at least in part on the sensor data, wherein the object data is indicative of one or more characteristics associated with the object;

generating an awareness challenge based at least in part on the object data, wherein the awareness challenge comprises a prompt based at least in part on the object data;

providing the prompt of the awareness challenge to an operator of the autonomous vehicle;

initiating a timer measuring elapsed time from a start time of a challenge response interval indicative of a first period of time for the operator to complete the awareness challenge;

communicating, to the operator of the vehicle, a soft notification indicative of the awareness challenge during the challenge response interval;

obtaining indicative of a user input in response to the prompt of the awareness challenge; and generating an operator score based at least in part on a comparison of the user input and the object data.

7. The computing system of claim 6, wherein the prompt of the awareness challenge comprises one or more questions associated with at least one of a type or a location of the object within the surrounding environment of the autonomous vehicle.

8. The computing system of claim 6, further comprising:

determining whether the user input satisfies the awareness challenge based at least in part on a comparison of the user input and the object data.

9. The computing system of claim 8, further comprising:

determining a rank of the operator in comparison to one or more other operators based at least in part on the operator score.

10. The computing system of claim 9, further comprising:

providing for display, via a user interface of a display device, data indicative of the rank of the operator in comparison to the one or more other operators.

11. The computing system of claim 6, wherein the operator of the autonomous vehicle is located within the autonomous vehicle.

12. An autonomous vehicle, comprising:

one or more output devices;

one or more vehicle sensors;

one or more processors; and one or more tangible, non-transitory, computer readable media that collectively store instructions that when executed by the one or more processors cause the autonomous vehicle to perform operations, the operations comprising:

obtaining, via the one or more vehicle sensors, sensor data associated with a surrounding environment of the autonomous vehicle;

determining object data associated with one or more objects within the surrounding environment based at least in part on the sensor data, wherein the object data is indicative of one or more characteristics associated with each of the one or more objects;

generating an awareness challenge based at least in part on the object data, wherein the awareness challenge comprises one or more prompts based at least in part on the object data;

providing, via the one or more output devices, the one or more prompts of the awareness challenge to an operator of the autonomous vehicle;

obtaining, via one or more input devices, data indicative of a user input in response to the one or more prompts of the awareness challenge; and generating an operator score based at least in part on a comparison of the user input and the object data.

13. The autonomous vehicle of claim 12, wherein the operations further comprise:

providing, via the one or more output devices, the operator score to the vehicle operator of the autonomous vehicle.

14. The autonomous vehicle of claim 12, wherein the operations further comprise:

providing, via the one or more output devices, the user input, object data, and the operator score to one or more servers for storage as part of an operator history associated with the vehicle operator.

15. The autonomous vehicle of claim 12, wherein the one or more prompts of the awareness challenge comprise one or more questions based at least in part on the object data.

* * * * *